(12) United States Patent
Weyers et al.

(10) Patent No.: US 12,426,350 B2
(45) Date of Patent: Sep. 23, 2025

(54) SEMICONDUCTOR DEVICE WITH DIODE CHAIN CONNECTED TO GATE METALLIZATION

(71) Applicant: Infineon Technologies AG, Neubiberg (DE)

(72) Inventors: Joachim Weyers, Hoehenkirchen (DE); Anton Mauder, Kolbermoor (DE); Ralf Siemieniec, Villach (AT); Guang Zeng, Haar (DE)

(73) Assignee: Infineon Technologies AG, Neubiberg (DE)

( * ) Notice: Subject to any disclaimer, the term of this patent is extended or adjusted under 35 U.S.C. 154(b) by 509 days.

(21) Appl. No.: 17/838,490

(22) Filed: Jun. 13, 2022

(65) Prior Publication Data

US 2022/0406928 A1 Dec. 22, 2022

(30) Foreign Application Priority Data

Jun. 16, 2021 (EP) ..................... 21179748

(51) Int. Cl.
*H10D 84/00* (2025.01)
*H10D 30/66* (2025.01)
(Continued)

(52) U.S. Cl.
CPC ......... *H10D 84/144* (2025.01); *H10D 30/668* (2025.01); *H10D 62/127* (2025.01); *H10D 62/8325* (2025.01)

(58) Field of Classification Search
CPC ............. H01L 29/7805; H01L 29/0696; H01L 29/1608; H01L 29/7813; H01L 29/7811; H01L 29/0619; H01L 29/0692; H01L 29/4238; H01L 29/8611; H01L 29/7397; H01L 29/045; H01L 29/20; H01L 27/0255; H01L 29/66613–66628; H01L 29/7825; H01L 2924/12036; H01L 29/66136; H10D 84/144; H10D 30/668; H10D 62/127; H10D 62/8325; H10D 8/411; H10D 84/143; H10D 12/481; H10D 30/665; H10D 62/106;
(Continued)

(56) References Cited

U.S. PATENT DOCUMENTS

| 5,642,252 A | 6/1997 | Sakamoto et al. |
| 2014/0210352 A1* | 7/2014 | Grajcar ............... H05B 45/3725 315/122 |

(Continued)

*Primary Examiner* — Shahed Ahmed
(74) *Attorney, Agent, or Firm* — Murphy, Bilak & Homiller, PLLC

(57) ABSTRACT

A semiconductor device includes a transistor cell with a source region of a first conductivity type and a gate electrode. The source region is formed in a wide bandgap semiconductor portion. A diode chain includes a plurality of diode structures. The diode structures are formed in the wide bandgap semiconductor portion and electrically connected in series. Each diode structure includes a cathode region of the first conductivity type and an anode region of a complementary second conductivity type. A gate metallization is electrically connected with the gate electrode and with a first one of the anode regions in the diode chain. A source electrode structure is electrically connected with the source region and with a last one of the cathode regions in the diode chain.

19 Claims, 12 Drawing Sheets

(51) Int. Cl.
*H10D 62/10* (2025.01)
*H10D 62/832* (2025.01)

(58) Field of Classification Search
CPC .. H10D 62/126; H10D 89/611; H10D 12/411; H10D 30/60; H10D 84/811–817; H10D 84/611–619; H10D 84/403–409
See application file for complete search history.

(56) References Cited

U.S. PATENT DOCUMENTS

| | | |
|---|---|---|
| 2014/0319540 A1 | 10/2014 | Sugimoto et al. |
| 2017/0271457 A1 | 9/2017 | Onogi et al. |
| 2017/0345917 A1* | 11/2017 | Basler .............. H03K 17/08122 |
| 2020/0401172 A1* | 12/2020 | Richmond ......... H03K 17/0822 |

* cited by examiner

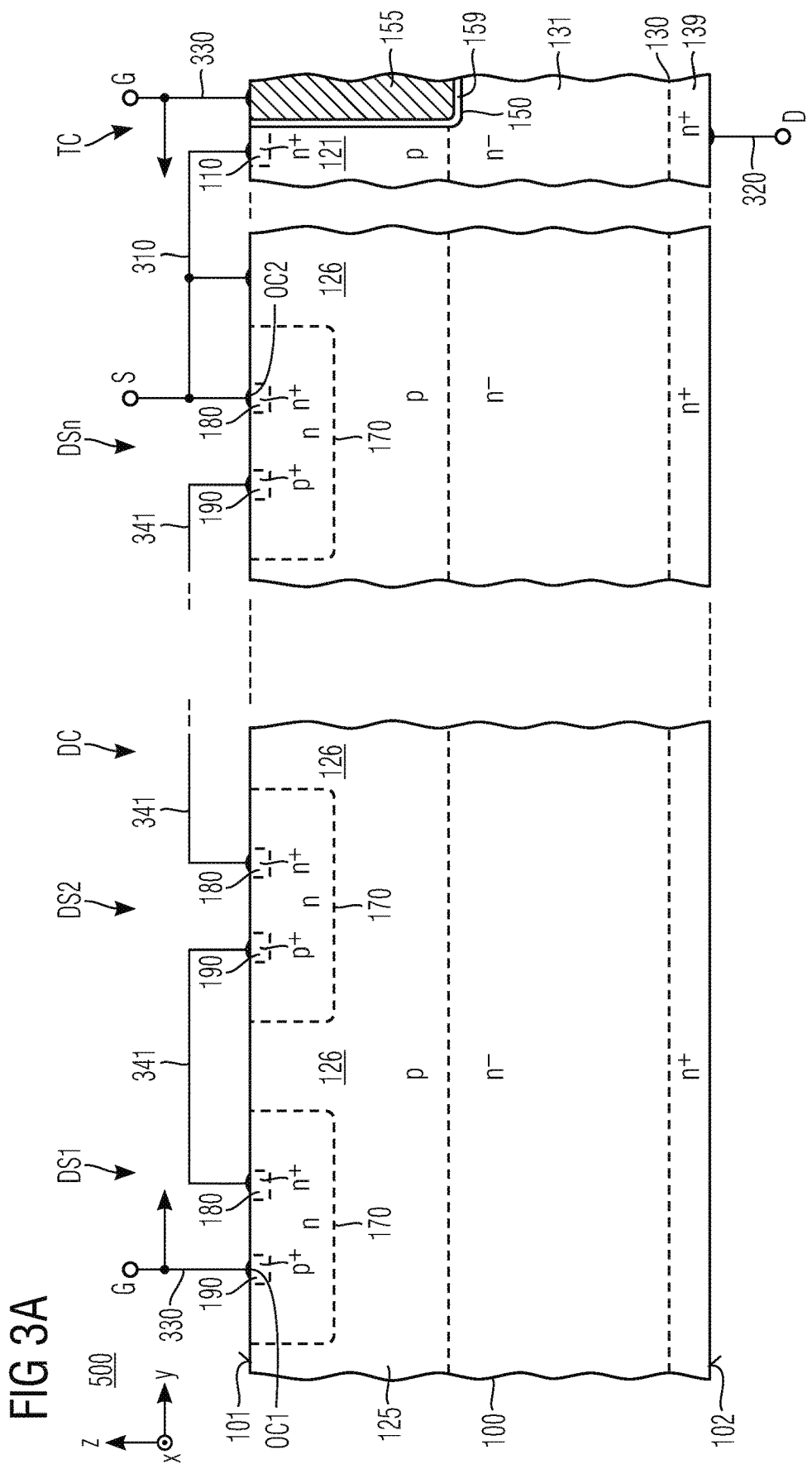

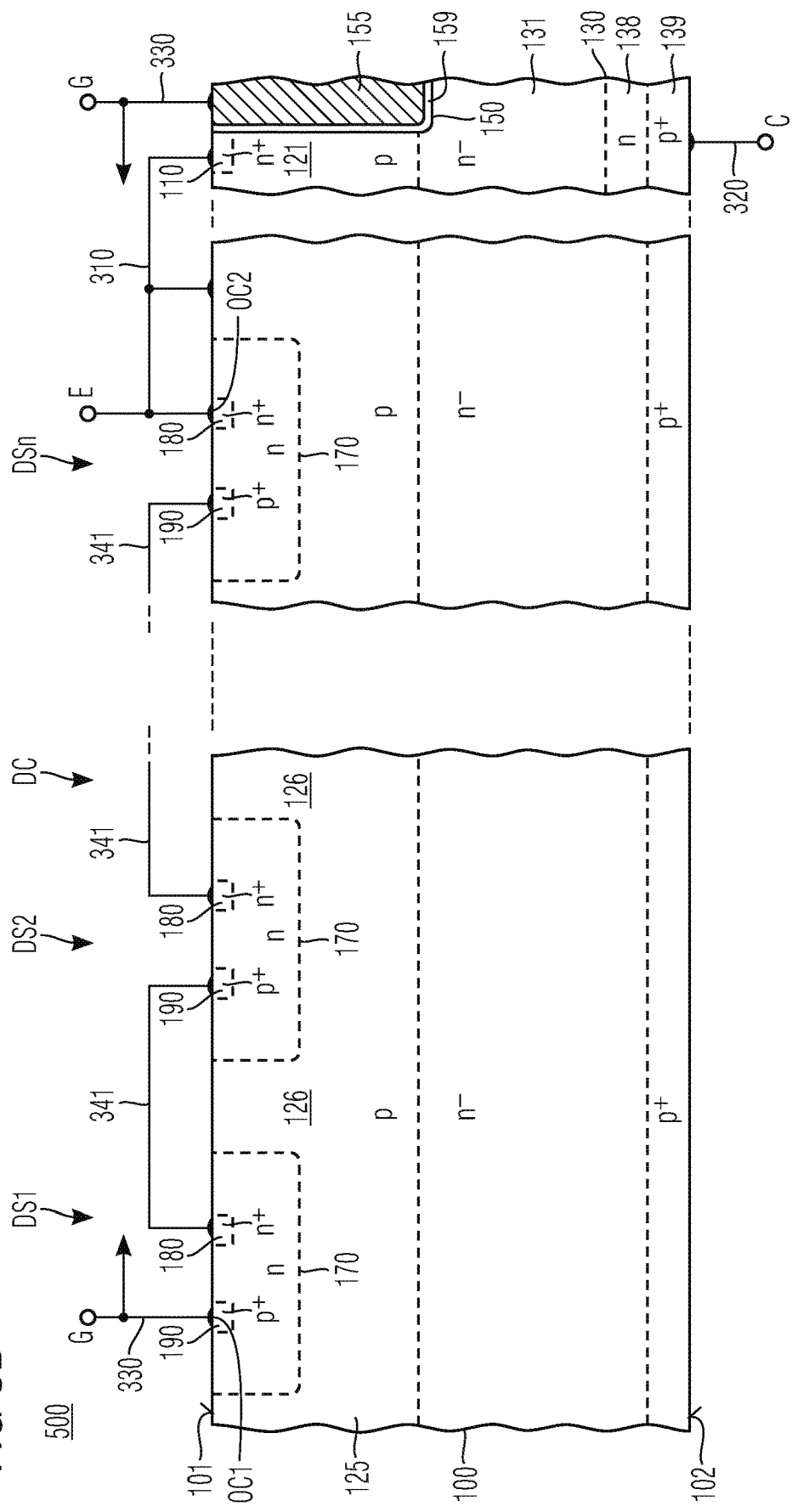

SEMICONDUCTOR DEVICE WITH DIODE CHAIN CONNECTED TO GATE METALLIZATION

TECHNICAL FIELD

Examples of the present disclosure relate to a semiconductor device with a diode chain connected to a gate metallization, wherein the diode chain reduces the thermal stress the semiconductor device is exposed to.

BACKGROUND

Short-circuit capability is a measure of the time a power semiconductor device can conduct a short-circuit current under predefined short-circuit conditions before it is irreversibly damaged. Since in semiconductor switches like IGBTs (insulated gate bipolar transistor) and MOSFETs (metal oxide semiconductor field effect transistors) the short-circuit current saturates, a short-circuit protection circuit typically has sufficient time to turn off the semiconductor switch once a short-circuit condition is detected. However, as semiconductor switches evolve toward low conduction losses, cell density and transconductance increase, and the resulting higher current density in the short circuit condition leads to lower short circuit capability, i.e., shorter admissible short-circuit times. On the other hand, typical applications for semiconductor switches require higher short-circuit capability, i.e., longer admissible short circuit times, in order to reduce power losses and to avoid additional effort, e.g., to distinguish an actual short circuit condition from an allowable high-current condition.

The continuing demand to improve energy efficiency and reduce costs is driving the trend towards higher current densities in semiconductor switches. At the same time, there is a continuing need for sufficiently high short-circuit capability.

SUMMARY

Embodiments of the present disclosure are aimed at increasing short-circuit capability without increasing semiconductor device size or circuit complexity and without increasing conduction losses.

To this purpose, an embodiment of the present disclosure relates to a semiconductor device that includes a transistor cell with a source region of a first conductivity type and a gate electrode. The source region is formed in a wide bandgap semiconductor portion. A diode chain includes a plurality of diode structures. The diode structures are formed in the wide bandgap semiconductor portion and are electrically connected in series. Each diode structure includes a cathode region of the first conductivity type and an anode region of a complementary second conductivity type. A gate metallization is electrically connected with the gate electrode and with a first one of the anode regions in the diode chain. A source electrode structure is electrically connected with the source region and with a last one of the cathode regions in the diode chain.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the embodiments and are incorporated in and constitute a part of this specification. The drawings illustrate embodiments of a semiconductor device and together with the description serve to explain principles of the embodiments. Further embodiments are described in the following detailed description and the claims. Features of the various illustrated embodiments may be combined with each other.

FIG. 3A shows a schematic vertical cross-sectional view of an MOSFET according to an embodiment.

FIG. 3B shows a schematic vertical cross-sectional view of an IGBT according to an embodiment.

DETAILED DESCRIPTION

Figure 1:
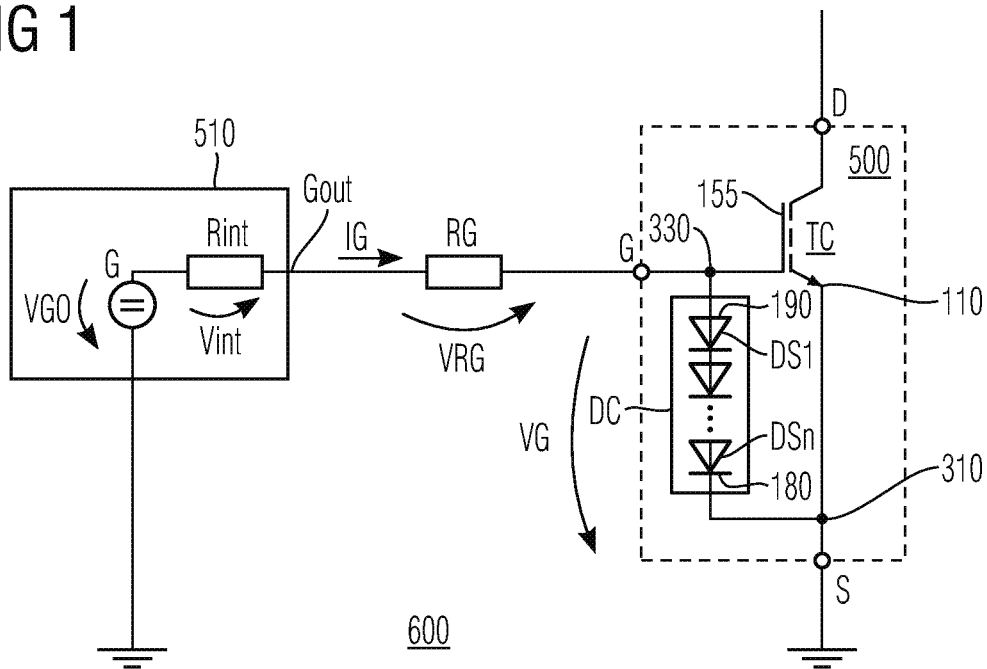
FIG. 1 shows a schematic circuit diagram of a semiconductor assembly with a semiconductor device including a diode chain for temperature-dependent gate control formed in a single crystalline semiconductor portion according to an embodiment.

In the following detailed description, reference is made to the accompanying drawings, which form a part hereof and in which are shown by way of illustrations specific embodiments in which a semiconductor device may be practiced. It is to be understood that other embodiments may be utilized and structural or logical changes may be made without departing from the scope of the present disclosure. For example, features illustrated or described for one embodiment can be used on or in conjunction with other embodiments to yield yet a further embodiment. It is intended that the present disclosure includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open, and the terms indicate the presence of stated structures, elements or features but do not preclude the presence of additional elements or features. The articles "a", "an" and "the" are intended to include the plural as well as the singular, unless the context clearly indicates otherwise.

The term "electrically connected" describes a permanent low-resistive ohmic connection between electrically connected elements, for example a direct contact between the concerned elements or a low-resistive connection via a metal and/or heavily doped semiconductor material.

An "ohmic contact" is a non-rectifying electrical junction with a linear or almost linear current-voltage characteristic.

A safe operating area (SOA) defines voltage and current conditions over which a semiconductor device can be expected to operate without self-damage. The SOA is given by published maximum values for device parameters like maximum continuous load current, maximum gate voltage, maximum junction temperature and others.

The Figures illustrate relative doping concentrations by indicating "−" or "+" next to the doping type "n" or "p". For example, "n−" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

Ranges given for physical dimensions include the boundary values. For example, a range for a parameter y from a to b reads as a≤y≤b. The same holds for ranges with one boundary value like "at most" and "at least".

The term "on" is not to be construed as meaning only "directly on". Rather, if one element is positioned "on" another element (e.g., a layer is "on" another layer or "on" a substrate), a further component (e.g., a further layer) may be positioned between the two elements (e.g., a further layer may be positioned between a layer and a substrate if the layer is "on" said substrate).

Two adjoining doping regions in a semiconductor portion form a semiconductor junction. Two adjoining doping regions of the same conductivity type and with different dopant concentrations form a unipolar junction, e.g., an n/n+ or p/p+ junction along a boundary surface between the two doping regions. At the unipolar junction a dopant concentration profile orthogonal to the unipolar junction may show a step or a turning point, at which the dopant concentration profile changes from being concave to convex, or vice versa. Two adjoining doping regions of complementary conductivity form a pn junction.

A semiconductor device may include a transistor cell, wherein the transistor cell may include a source region of a first conductivity type and a gate electrode. The source region is formed in a wide bandgap semiconductor portion.

The wide bandgap semiconductor portion may have two essentially parallel main surfaces, which may have approximately the same shape and size. The wide bandgap semiconductor portion 100 may have a surface extension along two horizontal directions and may have a thickness along a vertical direction perpendicular to the horizontal directions. In the following, the horizontal directions are also referred to as lateral directions, the main surface at the front side is referred to as first surface and the main surface at the side opposite to the front side is referred to as second surface. A lateral outer surface connects the edge of the first surface with the edge of the second surface.

The wide bandgap semiconductor portion includes a semiconducting part formed from a wide bandgap semiconductor. The wide bandgap semiconductor has a bandgap greater than that of silicon, e.g. greater than 1.2 eV such as gallium arsenide (GaAs) or greater than 3 eV. For example, the wide bandgap semiconductor may be gallium nitride (GaN) or silicon carbide (SiC), e.g., silicon carbide of a hexagonal polytype, e.g. the 4H-polytype. In addition to the semiconducting part, the wide bandgap semiconductor portion may include functional structures from other materials like polycrystalline silicon, dielectrics, elemental metals, metal compounds and/or metal alloys. The functional structures may be formed in trenches extending from the first and/or second surface into the wide bandgap semiconductor portion and/or may be formed on the first surface and/or on the second surface.

The source region may extend from the first surface into the wide bandgap semiconductor portion. The gate electrode may be formed on the first surface or may extend from the first surface into the wide bandgap semiconductor portion.

The semiconductor device may further include a diode chain that includes a plurality of diode structures, wherein the diode structures are formed in the wide bandgap semiconductor portion and are electrically connected in series. Each diode structure includes a cathode region of the first conductivity type and an anode region of a complementary second conductivity type.

A gate metallization may be electrically connected with the gate electrode and with a first one of the anode regions in the diode chain. The gate metallization may contain at least one of an elemental metal, a metal alloy and a metal compound. The gate metallization includes a gate pad suitable as wire bond base. In addition, the gate metallization may include at least one of a gate runner and a gate finger.

A source electrode structure may be electrically connected with the source region and with a last one of the cathode regions in the diode chain. The source electrode structure may contain at least one of an elemental metal, a metal alloy and a metal compound. The source electrode structure includes at least a source pad suitable as wire bond base. In addition, the source electrode structure may include a source runner.

The source region, the cathode regions and the anode regions are single-crystalline doping regions of the wide bandgap semiconductor portion. The cathode region and the anode region of each diode structure are in direct contact with each other and form a pn junction. Each diode structure represents a monolithically integrated SiC bulk diode.

The semiconductor device may include one single diode chain or a plurality of diode chains electrically connected in parallel to each other, wherein the diode chains may have approximately the same temperature/forward voltage characteristic. In particular, all diode chains may include the same number of diode structures, wherein the dopant profiles of the anode and cathode regions of corresponding diode structures are at least approximately the same. The diode chains may have approximately the same current rating or different current ratings.

The number of diode structures in each diode chain is high enough such that at a temperature within the SOA (safe operating range) the total forward current through all diode chains leaves the on-state gate voltage sufficiently high for saturation of the transistor cells.

The temperature dependence of the built-in potential of the diode structures is used to gradually reduce the saturation current of the semiconductor device as the temperature of the wide bandgap semiconductor portion increases. In particular, the fact that during short-circuiting of a power semiconductor device the wide bandgap semiconductor portion is rapidly heated to temperatures beyond the maximum junction temperature (e.g. 175° C.), allows the temperature dependence of the built-in potential of the diode structures to be used to reduce the saturation current as the temperature of the wide bandgap semiconductor portion increases.

In particular, the diode chain may be designed to fulfill the following conditions:

Under normal operation conditions the sum of the built-in potentials of the diode structures is safely above the typical on-state gate-to-source voltage such that the diode chain does not adversely affect operation of the semiconductor device under conditions within the SOA. In particular, the forward current through the diode chain is sufficiently low such that for the maximum allowed gate voltage and the maximum junction temperature the forward current does not result in a more than negligible drop of the effective gate voltage.

At a temperature the wide bandgap semiconductor portion typically reaches in the short-circuit mode, the sum of the built-in potentials of the diode structures is such that a current through the diode chain causes a sufficiently high voltage drop in the gate feed line to reduce the gate-to-source voltage and, inherently, the saturation current of the semiconductor device to such a degree that short-circuit capability is significantly increased, e.g., by at least 10%, by at least 20% or by at least 50% compared to the saturation current without diode chain. The diode chain is further designed to discharge the gate capacity accordingly in sufficiently short time.

Since the diode chain and the transistor array with the transistor cells are monolithically integrated in close vicinity to each other in the same wide bandgap semiconductor portion, and below a surface passivation of the wide bandgap semiconductor portion, the diode chain can sense the temperature in the transistor array much faster as external current and/or voltage measurement methods. In particular, due to the short connection through thermally high-conductive silicon carbide and due to the absence of thermally insulating electrical (e.g. $SiO_2$) between the diode chain and the transistor array, a time period between occurrence of high junction temperature in the transistor array and the thermal response of the diode chain can be very short. Since the diode chain uses no external components outside the wide bandgap semiconductor portion, the reliability of the protection function embodied by the diode chain is high. The dynamic behavior of the diode chain is comparatively smooth, e.g. when compared to solutions using the temperature dependency of a breakdown voltage.

The diode chain ensures high short-circuit capability even for high gate voltages and high current densities and therefore contribute in increasing power efficiency.

In particular in IGBT modules and power conversion circuits such as DC/DC converters, AC/DC converters, DC/AC converters the diode chain can contribute to improving energy efficiency and saving energy.

According to an embodiment, the gate metallization and the first one of the anode regions in the diode chain may form a first ohmic contact, in particular a low-resistive ohmic contact. The first one of the anode regions is the anode region of the first diode structure counted from the gate metallization.

According to an embodiment, the source electrode structure and the last one of the cathode regions in the diode chain may form a second ohmic contact, in particular a low-resistive ohmic contact. The last one of the cathode regions is the cathode region of the last diode structure counted from the gate metallization.

For each neighboring pair of the diode structures a wiring structure may form an ohmic contact with the cathode region of a first one of the neighboring diode structures and may form an ohmic contact with the anode region of a second one of the neighboring diode structures.

The wiring structure contains at least one of heavily doped polycrystalline silicon, an elemental metal, a metal alloy and/or a metal compound. Each neighboring pair of diode structures includes two neighboring diode structures.

The gate metallization, the source electrode structure and the wiring structure may include laterally separated sections of a thin metallization layer. The thin metallization layer may be a uniform layer of homogenous composition or may be layer stack including two or more sub-layers of different composition, wherein the sub-layers differ in at least one of material composition, density and stoichiometry. For example, the thin metallization layer may include a tungsten layer (W) and/or an aluminum copper (AlCu) layer in combination with at least one of a titanium nitride (TiN) layer, titanium (Ti) layer, tantalum nitride (TaN) layer, tantalum layer (Ta) and a nickel aluminum (NiAl) layer.

By providing the wiring structure from the same material as the thin metallization layer portion of the source electrode structure, the wiring structure may be formed with no additional effort by only modifying a photolithographic mask used for patterning the thin metallization layer.

According to an embodiment the semiconductor device may further include diode wells of the first conductivity type, wherein each anode region of the diode chain extends into one of the diode wells. The anode region and the diode well form a pn junction. For example, the anode regions of the diode chain may extend from the first surface of the wide bandgap semiconductor portion into the diode wells.

In addition, each cathode region of the diode chain may extend into the respective diode well. For example, the cathode regions of the diode chain may extend from the first surface of the wide bandgap semiconductor portion into the diode wells. The mean dopant concentration in the cathode region may be higher than in the diode well. The cathode region may be defined by ions locally implanted through the first surface into the diode well. The cathode region and the diode well form a unipolar junction.

The diode wells may extend into an oppositely doped layer, wherein the oppositely doped layer separates the diode wells from each other and from further doped regions of the conductivity type of the diode wells.

The diode wells decouple the diode chain to some degree from the current flow in the active transistor array.

According to an embodiment, a plurality of the transistor cells may be formed in a central region of the wide bandgap semiconductor portion and the diode chain may be formed in a peripheral region. The peripheral region may at least partially surround the central region.

The plurality of transistor cells form a transistor array of identical transistor cells electrically connected in parallel between the source electrode structure and a drain/drift structure. The peripheral region is formed between the active transistor array and the lateral outer surface of the wide bandgap semiconductor portion.

In typical silicon carbide devices, the peripheral region is large enough such that the diode chain can be formed entirely in the peripheral region without any need for increasing the size of the peripheral region compared to an equivalent semiconductor device without diode chain.

According to an embodiment, the diode wells extend from the first surface into a lateral extension region of the second conductivity type, wherein the lateral extension region extends outwardly from the central region into direction of a lateral outer surface of the wide bandgap semiconductor portion.

The lateral extension region laterally enlarges a doped body/shielding structure of the second conductivity type, which is formed in the central region with the transistor array. The lateral extension region may have the same vertical extension and the same vertical dopant profile as the body/shielding structure in the transistor array.

The lateral extension region may connect the doped body/shielding structure with an edge termination structure that may include a JTE (junction termination extension) with or without VLD (variation of lateral doping) and/or guard rings. A vertical extension of the lateral extension region may be greater than a vertical extension of the diode wells such that the diode wells end within the lateral extension region.

The lateral extension region separates the diode wells from each other and from further doped structures and decouples the diode chain to some degree from the current flow in the transistor array.

According to an embodiment, the gate electrodes of the transistor cells may be stripe-shaped, and the gate metallization may include a gate runner. The gate runner may be formed in the peripheral region and may be in direct contact with the gate electrodes For example, the gate electrodes may laterally protrude from the central region into the peripheral region to an extent that the gate runner crosses the gate electrodes on two opposite sides of the central region. In this case, the gate runner and the gate electrodes may be in direct contact with each other on both sides of the central region. Alternatively, a gate conductor plate formed on the first surface may laterally extend from the central region to the gate runner and may be in direct contact with both the gate electrodes and the gate runner. The gate conductor plate may be formed from the same material as the gate electrode and by the same deposition and patterning processes, wherein the gate electrodes and the gate conductor plate are formed as different sections of a deposited layer of conductive material, e.g. metallic polycrystalline silicon.

The gate runner and the anode region of the first diode structure of the diode chain form the low-resistive first ohmic contact. By forming the anode region of the first diode structure directly below or in close proximity to the gate runner, the connection between gate metallization and diode chain may be realized in a space-efficient way.

The gate runner may have three or four line portions, wherein each gate runner line portion extends parallel to one of the four chip edges. At most two gate runner line portions have a lateral longitudinal extension parallel to the lateral longitudinal extension of the stripe-shaped gate electrodes and at most two gate runner line portions have a lateral longitudinal extension orthogonal to the lateral longitudinal extension of the stripe-shaped gate electrodes.

According to an embodiment the diode wells of the diode chain may be arranged along a direction orthogonal to a lateral longitudinal extension of a nearest line portion of the gate runner.

The diode chain may be formed in vicinity to a gate runner line portion with a lateral longitudinal extension orthogonal to the stripe-shaped gate electrodes or in vicinity to a gate runner line portion with a lateral longitudinal extension parallel to the stripe-shaped gate electrodes.

In both cases the diode wells may be formed along a direction orthogonal to the nearest gate runner line portion. In other words, the diode wells are lined up one behind the other along a line orthogonal to the nearest gate runner line portion. Each diode well may be comparatively wide and each connection between the diode structures, the connection between the diode chain and the gate metallization, and the connection between the diode chain and the source electrode structure are short and wide. The parasitic ohmic resistance of the diode chain can be comparatively small.

According to another embodiment, the diode wells of the diode chain may be arranged along a direction parallel to a lateral longitudinal extension of a nearest line portion of the gate runner.

In other words, the diode wells are lined up one behind the other along a line parallel to the nearest line portion. A comparatively large number of diode structures can be provided in a comparatively narrow stripe between the gate runner and the source electrode structure.

According to an embodiment, the source electrode structure may include a source pad formed in the central region on the first surface. The source pad may include source contact structures extending from the source pad to the source regions of the transistor cells and electrically connecting the source pad and the source regions.

According to an embodiment, the diode chain may be formed between the source pad and the gate runner, wherein the source pad and the last one of the cathode regions in the diode chain form the low-resistive second ohmic contact. The second ohmic contact may be include one single part or may include a plurality of laterally separated parts.

For example, when source runners are absent and the source pad and the lateral extension region form at least one ohmic contact, a placement of the diode chain between the source pad and the gate runner in combination with an ohmic contact between the source pad and the last one of the cathode regions may be space-efficient.

According to an embodiment, the source electrode structure may include a source runner formed on the first surface, wherein the source runner and the lateral extension region form an ohmic contact, and wherein the source runner and the last one of the cathode regions in the diode chain form an ohmic contact.

In particular, the source runner may be formed between the gate runner and the lateral outer surface of the wide bandgap semiconductor portion.

The diode chain may be formed between the source runner and the gate runner. A placement of the diode chain between the source runner and the gate runner in combination with an ohmic contact between the source runner and the last one of the cathode regions can be a space-efficient.

According to an embodiment, the gate metallization may include a gate finger extending from the gate runner, e.g. from at least one of the second line portions of the gate runner into the central region. The diode chain may be formed parallel to and in close vicinity to the gate finger. For example, the diode chain and the gate finger are right next to each other without a transistor cell formed in between.

The gate finger runs parallel to the y-axis and orthogonal to the gate electrodes, wherein the gate finger and at least some of the gate electrodes are electrically connected. The gate finger may be connected to one second line portion and may be spaced from the opposite second line portion such that a bar portion (ridge) of the source pad connects two main parts of the source pad formed on opposite sides of the gate finger. Alternatively, the gate finger may connect the two second line portions of the gate runner on opposite sides of the central region and may separate the source pad in two main parts formed on opposite sides of the gate finger.

The diode chain may be formed between the gate finger and one or both of the two main parts of the source pad. In other words, the diode wells may be lined up one behind the other along a line parallel to the gate finger and between the gate finger and one of the main parts of the source pad.

The trench gate structures may be interrupted below the diode wells and may be connected through a gate connection plate as described above. Alternatively, the trench gate structures may be contiguous and the diode wells may be formed between neighboring trench gate structures.

According to another embodiment, the diode chain is surrounded by the source pad. In particular, the source pad may have an opening above the diode chain, wherein the diode chain may be completely surrounded by the source pad.

The first ohmic contact to the anode of the first diode structure of the diode chain may include several separated contact areas, wherein each contact area provides a low-resistive ohmic contact to another one of the gate electrodes. A source contact structure extending from the source pad to the cathode of the last diode structure of the diode chain forms the second ohmic contact of the diode chain.

FIG. 1 shows a switching assembly 600 including a gate driver circuit 510 and a semiconductor device 500 which is or includes a voltage-controlled switching device. The semiconductor device 500 includes a control head with a plurality of transistor cells TC electrically arranged in parallel. In the illustrated embodiment, the semiconductor device 500 is a MOSFET. In the alternative, the semiconductor device 500 may be or may include an IGBT or HEMT (high electron mobility transistor).

According to the illustrated embodiment the gate driver circuit 510 is a voltage source gate driver with a voltage source supplying a nominal gate output voltage VG0 and with a comparatively low internal series resistance Rint. In other embodiments the gate driver circuit 510 is a current source gate driver with high internal parallel resistance.

A gate driver output Gout of the gate driver circuit 510 and a gate terminal G of the semiconductor device 500 are electrically connected, either directly or through a low-resistive gate resistor element RG. An effective gate input voltage VG at the gate terminal G is a function of the nominal gate output voltage VG0 and the voltages Vint, VRG across the internal series resistance Rint and the gate resistor element RG, wherein the latter depend on the static gate input current IG.

The gate driver circuit 510 is configured to generate a gate signal alternating between an active gate signal turning on the semiconductor device 500 and an inactive gate signal turning off the semiconductor device 500, and to output the gate signal at the gate driver output Gout. The active gate signal may have a voltage level exceeding a threshold voltage of the semiconductor device 500. The inactive gate signal may assume one or two voltage levels below the threshold voltage.

A diode chain DC including a number n of series-connected diode structures DS1, ..., DSn is connected in forward direction between the gate terminal G and the source terminal S, wherein the anode of the first diode structure DS1 in the diode chain DC is connected to the gate terminal G and the cathode of the last diode structure DSn is electrically connected to the source terminal S.

The gate terminal G may be part of a gate metallization 330, which connects the gate electrodes 155 of the transistor cells TC. Alternatively, a low-resistive ohmic path may electrically connect the gate terminal G and the gate metallization 330.

An integrated gate resistor (not shown in FIG. 1) may be formed between the gate terminal G and the gate metallization 330. The integrated gate resistor is in series connection with the external gate resistor element RG. The total gate resistance includes the integrated gate resistor and the external gate resistor element. In the following, the external gate resistor element RG is used as pars pro toto for the total gate resistance for simplicity.

The source terminal S may be part of a source electrode structure 310, which connects the source regions 110 of the transistor cells TC, or a low-resistive ohmic path electrically connects the source terminal G and the source electrode structure 310.

The n diode structures DS1, ... DSn are monolithically integrated bulk diodes with the anode regions 190 and the cathode regions 180 formed from a single-crystalline wide band-gap semiconductor, wherein a first one of the anode regions 190 in the diode chain DC is connected to the gate metallization 330 and wherein a last one of the cathode regions 190 in the diode chain DC is connected to the source electrode structure 310.

The built-in potential of the diode structures DS1, ..., DSn may be about VBG−0.4V, wherein VBG is the band gap, e.g. approximately 2.9V for SiC-MOSFETs. The number n of the diode structures DS1, ..., DSn may be between four and ten for SiC-MOSFETs.

In particular, the number n of the diode structures DS1, ..., DSn may be selected such that the sum of the built-in potentials of the diode structures DS1, ..., DSn at the safe upper limit for the junction temperature (maximum junction temperature T_max) is at least as high as the absolute maximum gate-to-source voltage VGS,max allowed for the semiconductor device 500. The built-in potential V_bi(T) of each diode structure DS1, ..., DSn depends on device design and may differ according to doping conditions in the diode structure DS1, ..., DSn. For example, V_bi(T) may be around 2.9V at 25° C. V_bi decreases with rising temperature at a rate that depends on doping and current density. For example, the built-in potential may decrease by approximately 2.3 mV/K. For an assumed maximum junction temperature T_max of e.g. 175° C., the built-in voltage is given by V_bi(T_max)=V_bi (25° C.)−2.3 mV/K×150K=2.555V.

The number n of series connected diode structures DS1, ..., DSn is set equal to or greater than V_GS,max/ V_bi(T_max). As an example, for SiC-MOSFETs the maximum continuous on gate voltage may be 18V. With T_max=175° C. and the further numerical examples from above, this yields in n≥18V/2.555V=7.04 and a minimum number of eight diode structures DS1, . . . , DSn in serial connection.

A forward current through the diode chain DC determines the static gate input current IG the gate driver circuit 510 supplies through the gate driver output Gout when the gate driver circuit 510 outputs the active gate signal.

The parameters of the diode chain DC are selected such that at temperatures below a maximum junction temperature the forward current through the diode chain DC (the static gate input current IG) is sufficiently small such that a voltage drop across the effective gate resistance Rint+RG does not significantly reduce the effective gate input voltage VG.

In addition, the parameters of the diode chain DC are selected such that at high temperatures indicating a short-circuit condition the forward current through the diode chain DC (the static gate input current IG) is sufficiently high such that a voltage drop across the effective gate resistance Rint+RG reduces the effective gate input voltage VG to such a degree that the saturation current of the semiconductor devices decreases by at least 10%, in particular by at least 50% compared to the saturation current at the maximum continuous gate-to-source voltage without diode chain.

The maximum junction temperature may be, e.g. 175 degree Celsius. The temperature indicating a short-circuit condition may be at least 100 degree Celsius higher than the maximum junction temperature. For example, the temperature indicating a short-circuit condition may be in a range from 600 degree Celsius to 700 degree Celsius or from 800 degree Celsius to 900 degree Celsius.

Figure 2:
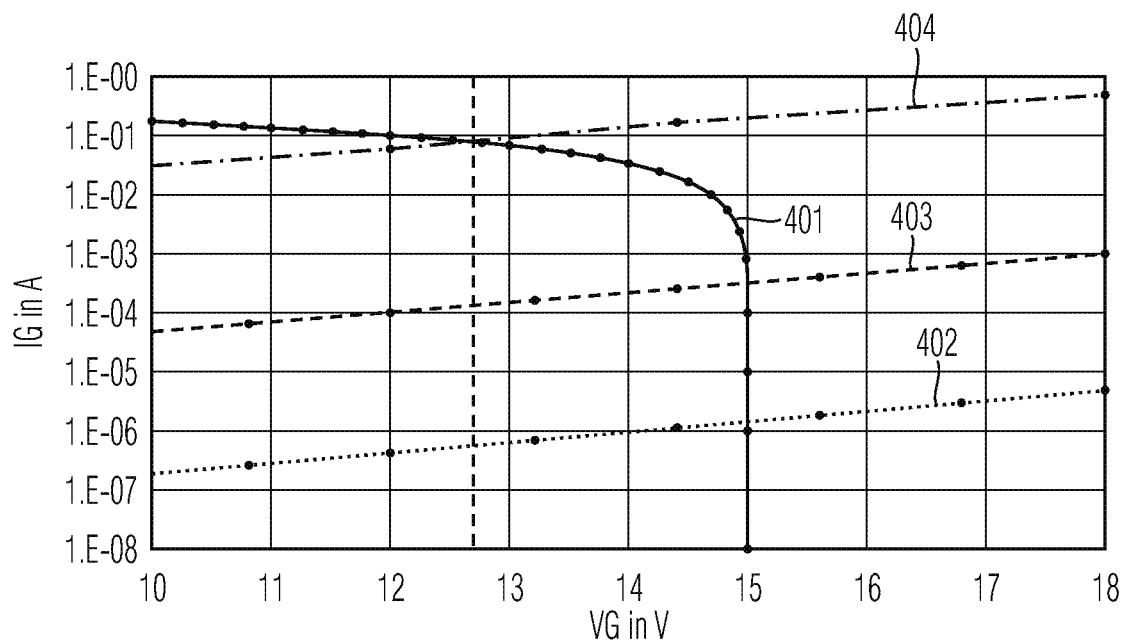
FIG. 2 shows a schematic diagram showing a gate input current as a function of an effective gate voltage for discussing effects of the embodiments.

FIG. 2 shows the static gate input current IG as a function of the effective gate input voltage VG at logarithmic scale. The nominal gate output voltage VG0 is 15V. The continuous line 401 represents the static gate input current IG through the effective gate resistance Rint+RG with IG=(VG0−VG)/(Rint+RG). Lines 402, 403, 404 represent the forward current through the diode chain at 50 degree Celsius, at 175 degree Celsius and at 325 degree Celsius. The intersection points between lines 402, 403, 404 and the continuous line 401 give the gate input current IG and the effective gate input voltage VG at the respective temperature.

Up to 175 degree Celsius, the diode chain DC has no significant effect on the effective gate input voltage VG. Starting from 175 degree Celsius, the voltage drop caused by the diode chain forward current (static gate input current IG) increasingly reduces the effective gate input voltage VG. At 325 degree Celsius the voltage drop caused by the diode chain forward current reduces the effective gate input voltage VG by more than 2V.

In typical SiC-MOSFETs, reducing the effective gate input voltage from 15V to 13V results in a reduction of the saturation current by approximately 50%. Reducing the saturation current by 50% extends the time the semiconductor device 500 can be operated in saturation by more than 50%, e.g. 5 μs to 10 μs. An additional short-circuit protection circuit gains more time to distinguish between a critical short-circuit condition and an allowable high-current condition.

For example, when a power semiconductor switch is turned on high capacitive loads like long cables may induce high and elongated current peaks in the power semiconductor switch. For conventional methods like DESAT, di/dt-measurement, direct current measurements and current measurement with sense cells it is difficult to discriminate between such capacitive peak current events and actual short-circuit events. In general, the issue is solved by elongating the response time before turning-off the power semiconductor switch after a suspicious signal is detected and to wait whether the suspicious signal vanishes of its own. However, long short circuit times are not compatible with the high current density in modern power semiconductor switches.

In addition, in half-bridge configurations unintentionally turning on both switches or choosing too short dead times between turn-off of the first switch and turn-on of the second switch may result in short-circuit conditions. Such unintentional, short-term short-circuit events may appear only in special operational states of a power electronic application. Very sensitive methods for detecting short circuits may trigger on these events requiring on the one hand stable control in any operational state of the power electronic application. On the other hand, these effects may not occur at the test bench during design of the power electronic application but only in the application.

In both cases a comparatively long waiting time prevents false triggering or increases ease of use of the power semiconductor switch. Instead, the diode chain according to the embodiments responds automatically to both excessive capacitive loads and short-circuit events and in each case avoids unhealthy operation of the power device. In addition, availability of the power semiconductor switch and the power electronic application can be extended to the physical limit of the power semiconductor switch.

FIGS. 3A and 3B concern semiconductor devices 500 with monolithically integrated diode chains DC.

In FIG. 3A the semiconductor devices 500 is or includes an IGFET (insulated gate field effect transistor) with a wide bandgap semiconductor portion 100, for example, an SiC-MOSFET (silicon carbide metal oxide semiconductor FET).

The wide bandgap semiconductor portion 100 includes or consists of a single crystalline wide bandgap semiconductor with a bandgap of at least 2 eV, e.g., a silicon carbide crystal including the main constituents silicon and carbon, gallium nitride GaN or gallium arsenide GaAs. The silicon carbide crystal may include dopant atoms and further impurities like hydrogen, fluorine and/or oxygen. The polytype of the silicon carbide crystal may be 15R or hexagonal, e.g. 2H, 6H, or 4H. The wide bandgap semiconductor portion 100 may include or consist of a silicon carbide layer grown by epitaxy.

A first surface 101 at a front side of the wide bandgap semiconductor portion 100 may be planar or ribbed. A mean plane of the first surface 101 extends along horizontal directions. The mean plane of a planar first surface 101 is identical with the planar first surface 101. In case of a non-planar first surface 101, for example in case of a ribbed first surface 101, the mean plane may be a planar least squares plane. Position and orientation of the planar least squares plane are defined such that the sum of the squares of the deviations of surface points of the ribbed first surface 101 from the planar least squares plane has a minimum.

Opposite to the front side, a second surface 102 of the wide bandgap semiconductor portion 100 extends parallel to the planar first surface 101 or parallel to the least squares plane of a ribbed first surface 101. A lateral outer surface connects the edge of the first surface 101 and the edge of the second surface 102.

The wide bandgap semiconductor portion 100 has a surface extension along two horizontal directions and a thickness along a vertical direction perpendicular to the horizontal directions. The horizontal directions are parallel to an x-axis and to a y-axis, wherein x-axis and y-axis are orthogonal to each other. The vertical direction is parallel to a z-axis, which is orthogonal to the x-axis and to the y-axis. In the following, the horizontal directions are also referred to as lateral directions.

The vertical direction may coincide with a main lattice direction or may be tilted to a main lattice direction by an off-axis angle, wherein the off-axis angle may be in a range from 2° to 8°, in particular about 4°.

The semiconductor device 500 includes a plurality of insulated gate transistor cells TC formed at the front side of the wide bandgap semiconductor portion 100 and electrically connected in parallel.

Each transistor cell TC includes a source region 110 and a body region 121, wherein the source region 110 and the body region 121 are doped portions of the wide bandgap semiconductor portion 100. The source region 110 has a first conductivity type. The body region 121 has a second conductivity type. In the illustrated embodiment, the source region 110 is n conducting, and the body region 121 is p conducting. The body region 121 may form part of a contiguous, doped body/shielding structure of the second conductivity type, wherein the doped body/shielding structure includes further regions, for example, a shielding region, a connection region, and/or a body contact region.

The transistor cells TC further include gate structures 150. In the illustrated embodiment, the gate structures 150 are trench gates extending from the first surface 101 into the wide bandgap semiconductor portion 100. Alternatively, the gate structures 150 may be planar gates formed on the first surface 101.

Each gate structure 150 includes a conductive gate electrode 155 and a gate dielectric 159 between the gate electrode 155 and the body region 121. The gate electrode 155 may include heavily doped polycrystalline silicon. The gate dielectric 159 may consist of or may include silicon oxide, silicon nitride and/or siliconoxynitride, by way of example.

A drain/drift region 130 laterally extends through the wide bandgap semiconductor portion 100 between the transistor cells TC and the second surface 102. The drain/drift region 130 may include a voltage sustaining structure, e.g., a charge compensation structure and/or a lightly doped drift zone 131. The drain/drift region 130 further includes a more heavily doped $n^+$ conductive contact layer 139 along the second surface 102.

A metallic source electrode structure 310 at the front side of the wide bandgap semiconductor portion 100 electrically connects the source regions 110 of the transistor cells TC. The source electrode structure 310 may include a source terminal S. Alternatively, a low-resistive ohmic path electrically connects the source electrode structure 310 and the source terminal S.

A metallic drain electrode structure 320 opposite to the front side of the wide bandgap semiconductor portion 100 and the contact layer 139 form an ohmic contact. The drain electrode structure 320 may include a drain terminal D. Alternatively, a low-resistive ohmic path electrically connects the drain electrode structure 320 and the drain terminal D.

A gate metallization 330 at the front side of the wide bandgap semiconductor portion 100 electrically connects the gate electrodes 155 of the transistor cells TC. The gate metallization 330 may include a gate terminal G. Alternatively, a low-resistive ohmic path electrically connects the gate metallization 330 and the gate terminal G.

A lateral extension region 125 of the second conductivity type extends from the first surface 101 into the wide bandgap semiconductor portion 100. The lateral extension region 125 may be a direct lateral extension of the body regions 121 or a further part of the contiguous doped body/shielding structure of the second conductivity type. The lateral extension region 125 and the drain/drift region 130 form a pn junction.

Diode wells 170 of the first conductivity type extend from the first surface 101 into the lateral extension region 125. The diode wells 170 and the lateral extension region 125 form pn junctions.

The lateral extension region 125 may include implanted connection regions 126, wherein each implanted connection region 126 extends from the first surface 101 into the wide bandgap semiconductor portion 100, and wherein each implanted connection region 126 laterally separates two neighboring diode wells 170 such that the lateral extension region 125 surrounds each diode well 170 on all sides within the wide bandgap semiconductor portion 100. Source contact structures may extend through the interlayer dielectric to each implanted connection region 126, thereby forming an ohmic contact between source electrode 310 and implanted connection region 126.

The diode wells 170 may be formed in close vicinity to each other, wherein portions of the lateral extension region 125, e.g. the implanted connection regions 126, laterally separate neighboring diode wells 170 from each other.

A dopant concentration in the lateral extension region 125 including the implanted connection regions 126 is selected sufficiently high to keep the gain of a parasitic vertical npn bipolar transistor small, which is formed by the n doped drain/drift zone 131, the lateral extension region 125 and the diode wells 170.

A p doped anode region 190 and an n doped cathode region 180 extend from the first surface 101 into each diode well 170. Each pair of an anode region 190 and a cathode region 180 in a diode well 170 form a diode structure DS. The number n of diode structures DS is between four and ten. The gate metallization 330 and the anode region 190 of a first diode structure DS1 form a first ohmic contact OC1. The source electrode structure 310 and the cathode region 180 of a last diode structure DSn form a second ohmic contact OC2.

For each pair of neighboring diode structures DS1, . . . , DSn, a wiring structure 341 forms an ohmic contact with the cathode region 180 of a first one of the neighboring diode structures DS and forms an ohmic contact with the anode region 190 of a second one of the neighboring diode structures DS. The diode structures DS1, . . . , DSn form a diode chain DC electrically connected in forward direction between the gate terminal G and the source electrode structure 310.

The source regions 110 of the transistor cells TC and the cathode regions 180 of the diode structures DS1, . . . , DSn may have the same vertical dopant profile and may result from the same ion implantation process(es). In particular, one single implant mask may define the source regions 110 and the cathode regions 180.

P doped body contact regions (or surface portions of p-type shielding regions) of the transistor cells TC and the anode regions 190 of the diode structures DS1, . . . , DSn may have the same vertical dopant profile and may result from the same ion implantation process(es). In particular, one single implant mask may define the body contact regions and the anode regions 190.

The n doped diode well 170, the lateral extension region 125 and the drain/drift structure 130 form a parasitic npn bipolar transistor, wherein a steep dV/dt signal at the drain side may excite a hole current flow along the bottom of the n doped diode wells 170 in direction of the source contacts of the p doped lateral extension region 125. However, subject to the condition that the conductivity of the lateral extension region 125 is sufficiently high, a resulting voltage drop along the pn junction between the diode well 170 and the lateral extension region 125 typically remains safely below the threshold required for starting a latch-up event. Since the wide bandgap of the material of the wide bandgap semiconductor portion 100 results in a comparatively high threshold voltage for latch-up, a moderate dopant concentration in the lateral extension region 125 may be sufficient under consideration of the reduction of the threshold voltage for latch-up with increasing temperature. In addition, the short charge carrier lifetime in SiC reduces the latch-up risk, because holes entering the diode wells 170 recombine fast.

In FIG. 3B the semiconductor device 500 is or includes an IGBT. The contact layer 139 may have the second conductivity type or may include zones of both conductivity types alternating along at least one lateral direction. A buffer layer 138 of the first conductivity type and with a higher dopant concentration than the drift zone 131 may be formed between the drift zone 131 and the contact layer 139 at least in a central region of the wide bandgap semiconductor portion 100, wherein the cell region includes the transistor array with the transistor cells TC.

The metallic source electrode structure 310 may include an emitter terminal E. Alternatively, a low-resistive ohmic path electrically connects the source electrode structure 310 and the emitter terminal E.

The metallic drain electrode structure 320 may include a collector terminal C. Alternatively, a low-resistive ohmic path electrically connects the drain electrode structure 320 and the collector terminal C.

Figure 4A:
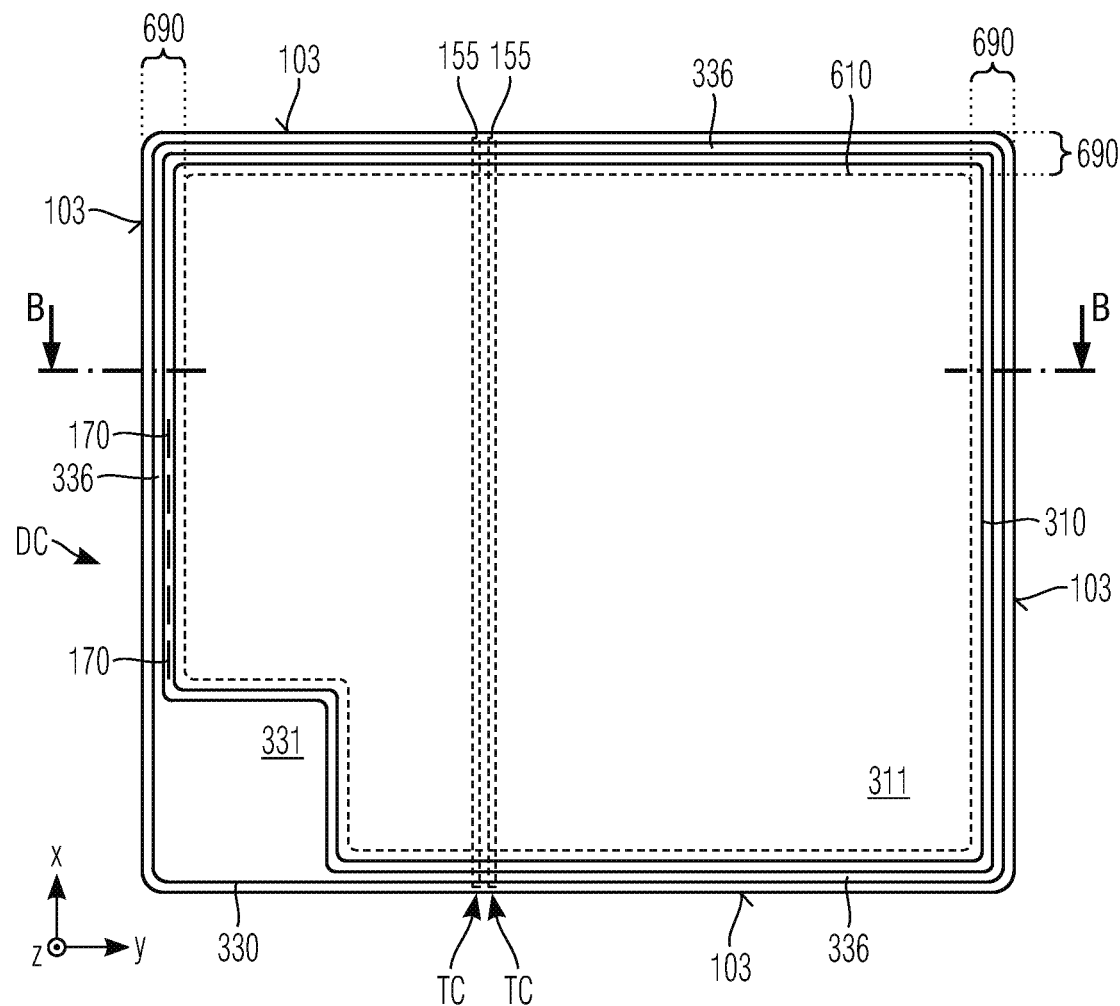
FIGS. 4A and 4B show a schematic plan view and a schematic vertical cross-sectional view of a semiconductor device according to an embodiment with the diode chain formed between a source pad and a gate runner.
Figure 4B:
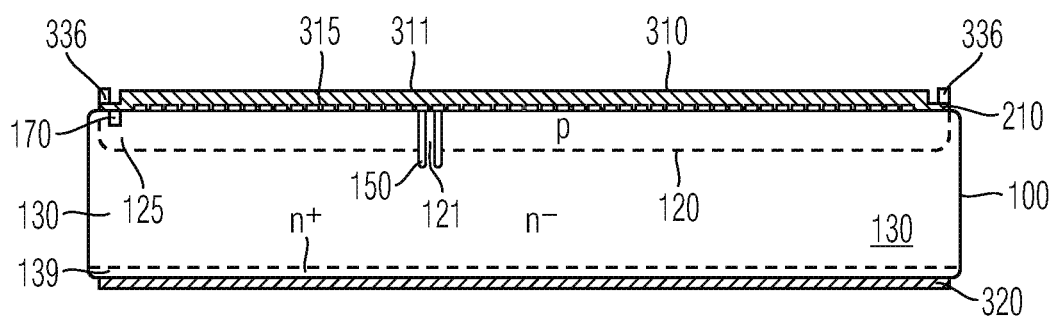

FIGS. 4A and 4B show a semiconductor device 500 with a central region 610 and a peripheral region 690 surrounding the central region 610. Stripe-shaped transistor cells TC are formed in the central region 610. The transistor cells TC include stripe-shaped gate electrodes 155 with a lateral longitudinal extension parallel to the x axis.

The source electrode structure 310 includes a metal source pad 311 with source contact structures 315 extending through openings in an interlayer dielectric 210 to or into the source regions of the transistor cells TC. The gate electrodes 155 extend beyond the edges of the source pad 311 and into the peripheral region 690.

The gate metallization 330 includes a gate pad 331 and a gate runner 336. The gate runner 336 is formed in the peripheral region 690 between the source pad 311 and the lateral outer surface 103 of the wide bandgap semiconductor portion 100 and is in direct contact with the gate pad 331.

The gate runner 336 has first line portions with a lateral longitudinal extension parallel to the y-axis. The first line portions cross the gate electrodes 155 and form low-resistive contacts with the gate electrodes 155. One of the first line portions may be directly connected to the gate pad 331.

Between the gate pad 331 and the gate runner 336 an integrated gate resistor may be included (not shown in FIGS. 4A, 4B). In this case, the metallic connection between the gate pad 331 and the gate runner 336 may be missing. Instead, the gate pad 331 is electrically connected to a first side of the integrated gate resistor and the gate runner 336 is electrically connected to a second side of the integrated gate resistor. The integrated gate resistor may include doped polycrystalline silicon, a thin metal line and/or a doped region in the wide bandgap semiconductor portion 100.

The gate runner 336 may include one or two second line portions with a lateral longitudinal extension parallel to the x-axis. One of the second line portions may connect one of the first line portions and the gate pad 331.

The semiconductor device 500 may be a SiC-MOSFET with a voltage blocking capability in a range from 400V to 10 kV or more.

The lateral extension region 125 is a direct lateral extension of a contiguous p doped body/shielding structure 120 that includes the body regions 121 of the transistor cells TC. The diode wells 170 of the diode chain DC may be formed between the source pad 311 and at least one of the second line portions of the gate runner 336.

Figure 5A:
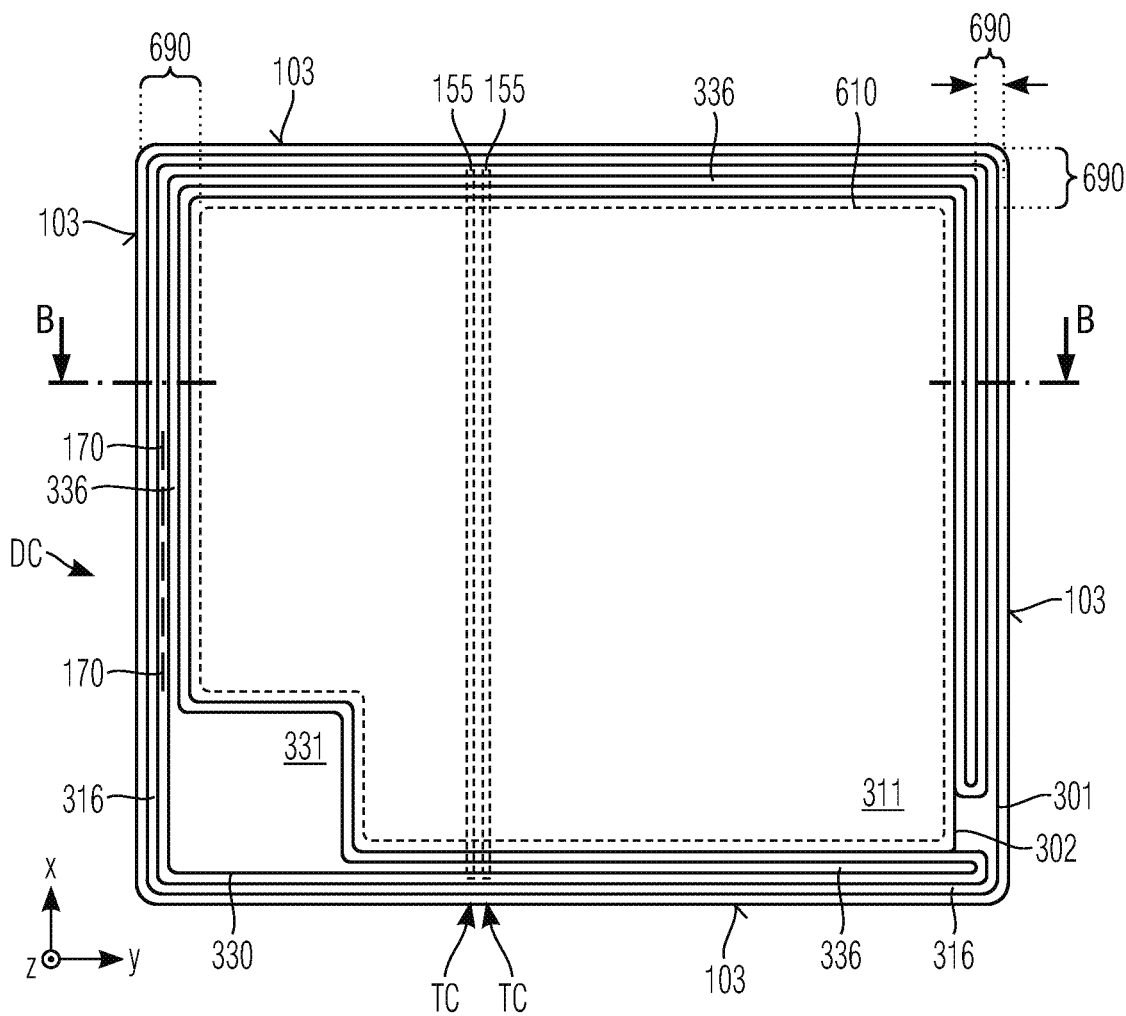
FIGS. 5A and 5B show a schematic plan view and a schematic vertical cross-sectional view of a semiconductor device according to an embodiment with the diode chain formed between a gate runner and a source runner.
Figure 5B:
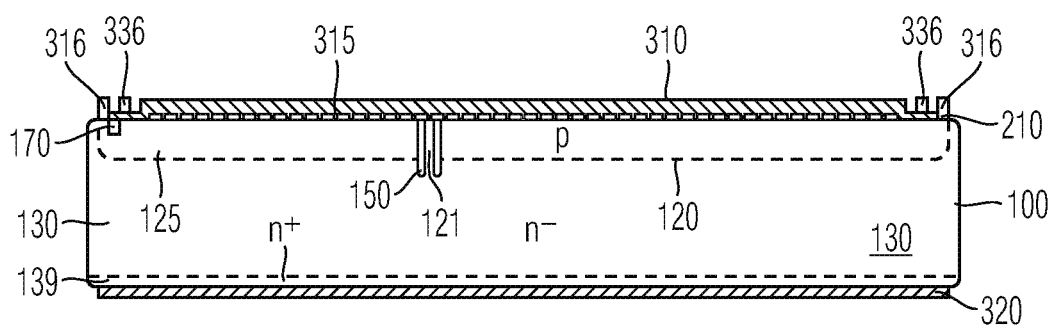

FIGS. 5A and 5B show another semiconductor device 500 with stripe-shaped gate electrodes 155 with a lateral longitudinal extension parallel to the x axis.

A gate runner 336 distributes the gate signal to the gate electrodes 155 of the transistor cells TC. A source runner 316 is formed on the first surface 101 between the gate runner 336 and the lateral outer surface 103 and connects an inner side of an edge termination structure to the source potential. The diode wells 170 of the diode chain DC are formed between the gate runner 336 and the source runner 316.

The source runner 316 reliably ties the edge termination structure to the source potential. Without the source runner 316 the comparatively high sheet resistance of the lateral extension region 125 in combination with the required minimum width of the gate runner 336 and the required minimum distance between the source pad 311 and the gate runner 336, a comparatively large electric resistance may be effective between source pad 311 and the inner edge of the edge termination region such that in case of fast transients the edge termination region is in danger to enter into an avalanche mode because its capacitance cannot be charged/discharged quickly enough.

Figure 6:
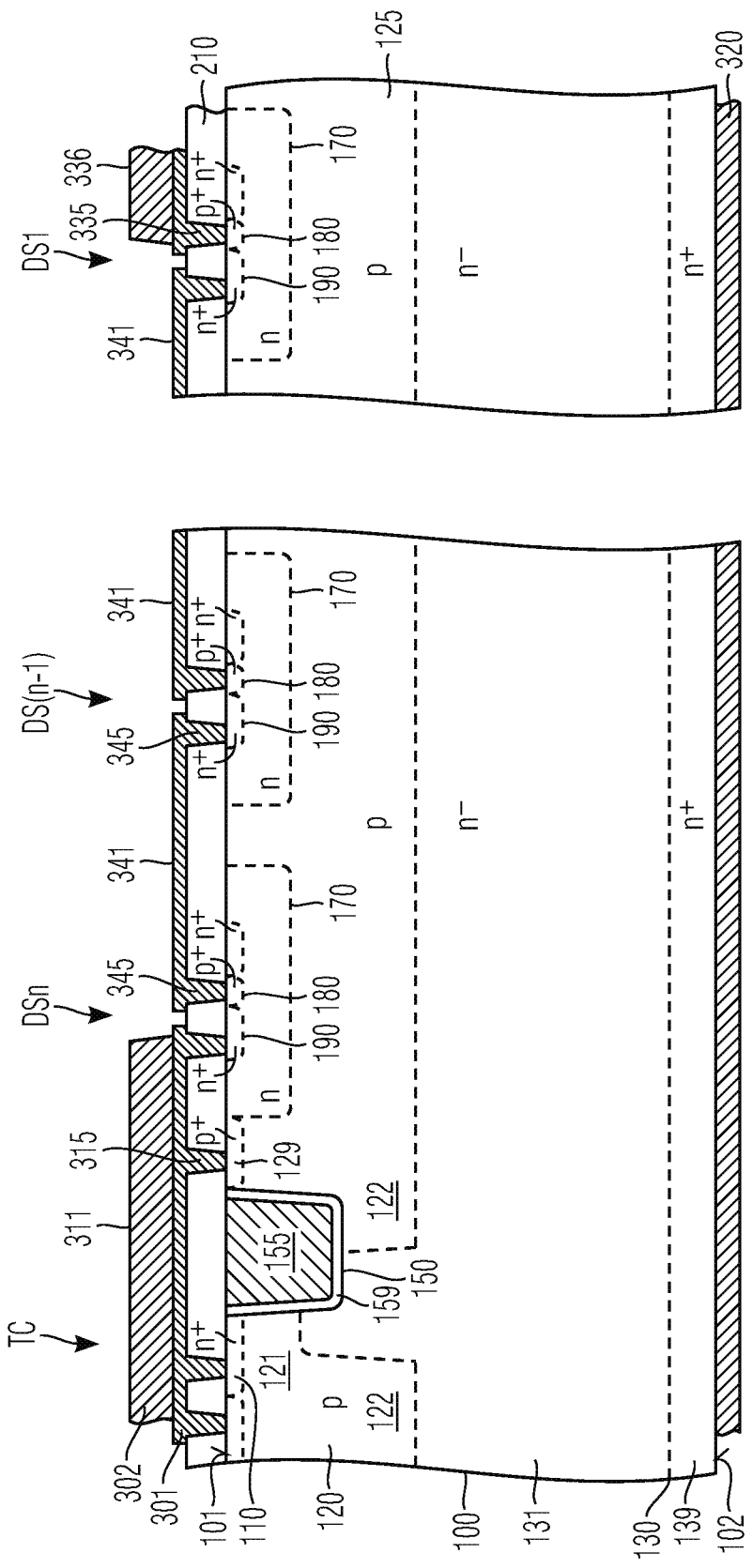
FIG. 6 shows a schematic vertical cross-sectional view of a SiC-TMOSFET according to an embodiment.

FIG. 6 concerns a SiC-TMOSFET (SiC Trench-MOSFET) with asymmetric transistor cells TC and trench gate structures 150. The sidewalls of the gate structures 150 are slightly tilted against the vertical direction such that one of the longitudinal gate structure sidewalls (the active sidewall) is parallel to a crystal plane with high electron mobility, e.g. the [11-20] crystal plane.

The source region 110 and the body region 120 of the transistor cell TC and a portion of the drain/drift structure 130 are in direct contact with the active sidewall of the gate structure 150. Along the inactive sidewall a shielding region 122 extends from the first surface 101 to below the bottom of the gate structure 150 and shields the bottom of the gate structure 150 against the drain potential. The shielding region 122 is part of the p doped body/shielding structure 120. The p doped body/shielding structure 120 may further include more heavily doped body contact regions 129 (surface regions) along the first surface 101.

The gate runner 336 includes gate/diode contact structures 335 extending through openings in the interlayer dielectric 210 to the anode region 180 of a first diode structure DS1.

The source pad 311 includes source contact structures 315 extending through openings in an interlayer dielectric 210 to the source regions 110, to the body contact regions 129 and to the cathode region 190 of a last diode structure DSn.

The wiring structures 341 include wiring contact structures 345 extending through openings in the interlayer dielectric 210 to the remaining anode regions 180 and cathode regions 190 of the diode structures DS1, . . . , DSn. A distance between a wiring structures 341 and the source electrode structure 310 and a distance between a wiring structures 341 and the gate metallization can be 2 μm or greater.

A source electrode structure including the source pad 311 and a gate metallization including the gate runner 336 have the same material configuration. In particular, the source pad 311 and the gate runner 336 include a section of a thin metallization layer 301 and a section of a thick metallization layer 302 formed directly on the thin metallization layer 301.

The wiring structures 341 may be formed from a further section of the thin metallization layer 301.

The thin metallization layer 301 may consist of tungsten (W) or may include a tungsten (W) sub-layer and at least one further sub-layer formed between the tungsten (W) sub-layer and the interlayer dielectric 210. The further sub-layer may include titanium (Ti), titanium nitride (TiN), tantalum (Ta), tantalum nitride (TaN) and/or another elemental metal, metal compound or metal alloy. A thickness of the thin metallization layer 301 may be in a range from 100 nm to 500 nm, by way of example.

The thick metallization layer 302 may consist of copper (Cu), aluminum (Al) or an alloy containing at least one of copper (Cu) and aluminum (Al). A thickness of the thick metallization layer 302 may be in a range from 2 µm to 10 µm, by way of example.

Figure 7A:
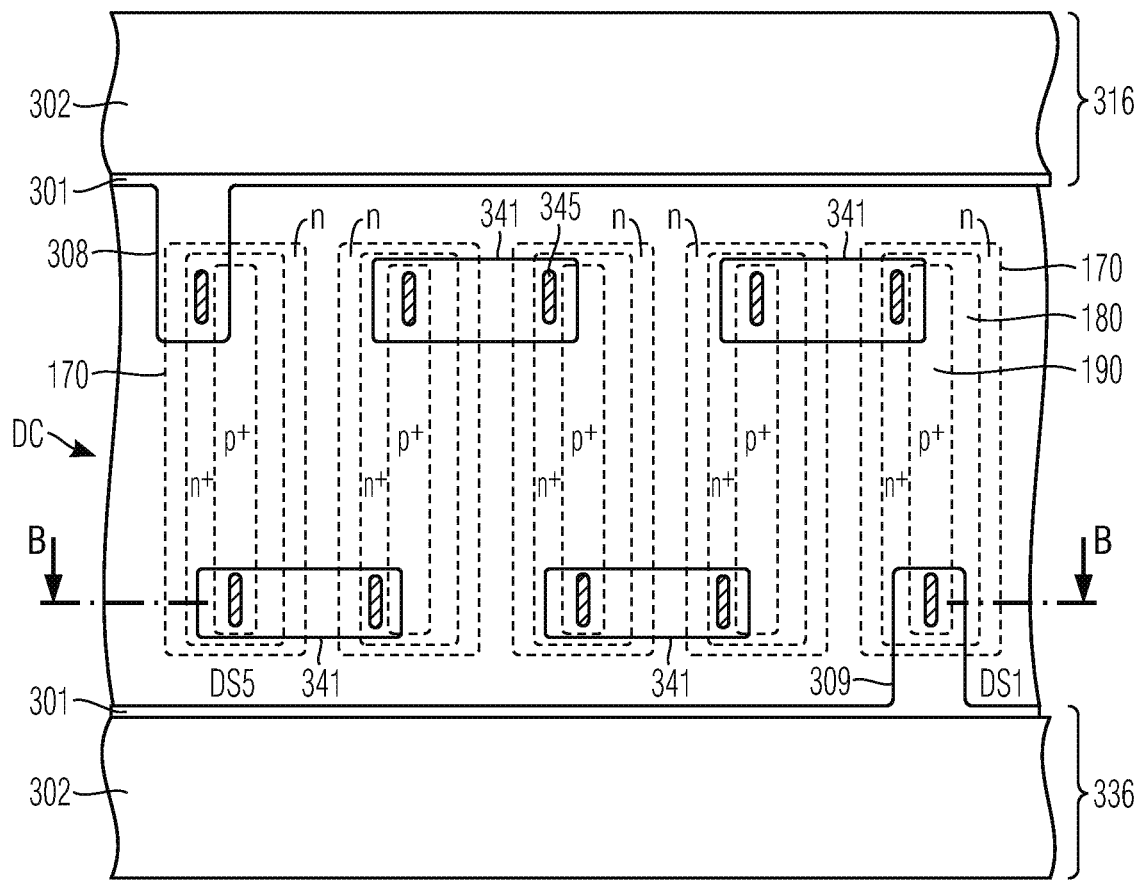
FIGS. 7A and 7B show a schematic plan view and a schematic vertical cross-sectional view of a semiconductor device according to an embodiment with the diode chain including laterally separated stripe-shaped diode wells arranged along a direction parallel to a lateral longitudinal extension of a nearest gate runner line portion.
Figure 7B:
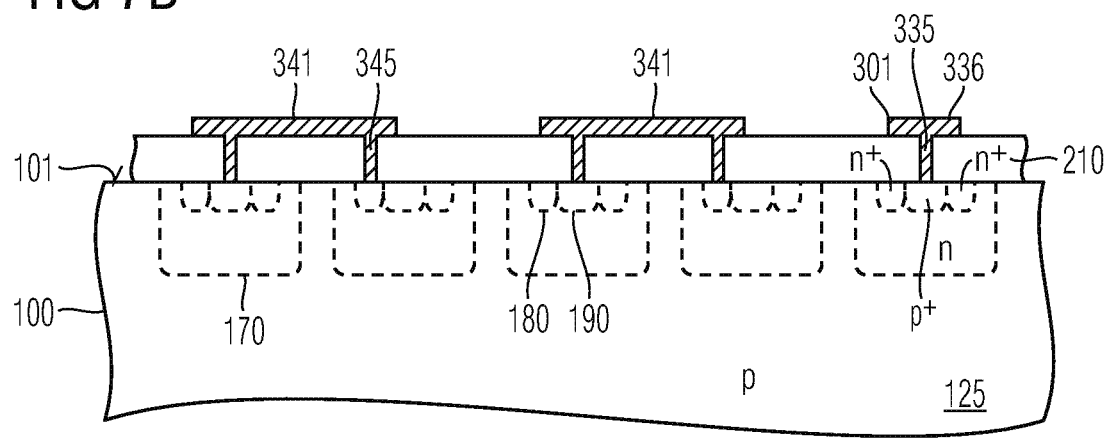

FIGS. 7A and 7B show a diode chain DC with five diode structures DS1, . . . , DS5 formed between a line portion of a gate runner 336 and a source runner 316, wherein the gate runner line portion runs along the x-axis parallel to the gate electrodes or along the y-axis orthogonal to the gate electrodes.

The diode wells 170 of the diode chain DC are arranged along a direction parallel to a lateral longitudinal extension of a nearest line portion of the gate runner 336, wherein the diode wells 170 are lined up one behind the other along a line parallel to the nearest gate runner line portion.

The section of the thin metallization layer 301 forming part of the gate runner 336 has a lateral bulge 309 that laterally protrudes to above the anode region 190 of the first diode structure DS1. The thin metallization layer portion 301 of the source runner 316 has a lateral bulge 308 that laterally protrudes to above the cathode region 180 of the fifth diode structure DS5. The wiring structures 341 connecting the anode regions 190 and cathode regions 180 of the diode structures DS are formed from further, laterally separated sections of the thin metallization layer 301.

Typically, e.g. when using wet etching for patterning the thick metallization layer 302, gaps of 10 µm to 20 µm, e.g. 12 µm to 15 µm separate neighboring sections of the patterned thick metallization layer, wherein the gaps provide sufficient space for the diode chain DC.

Figure 8A:
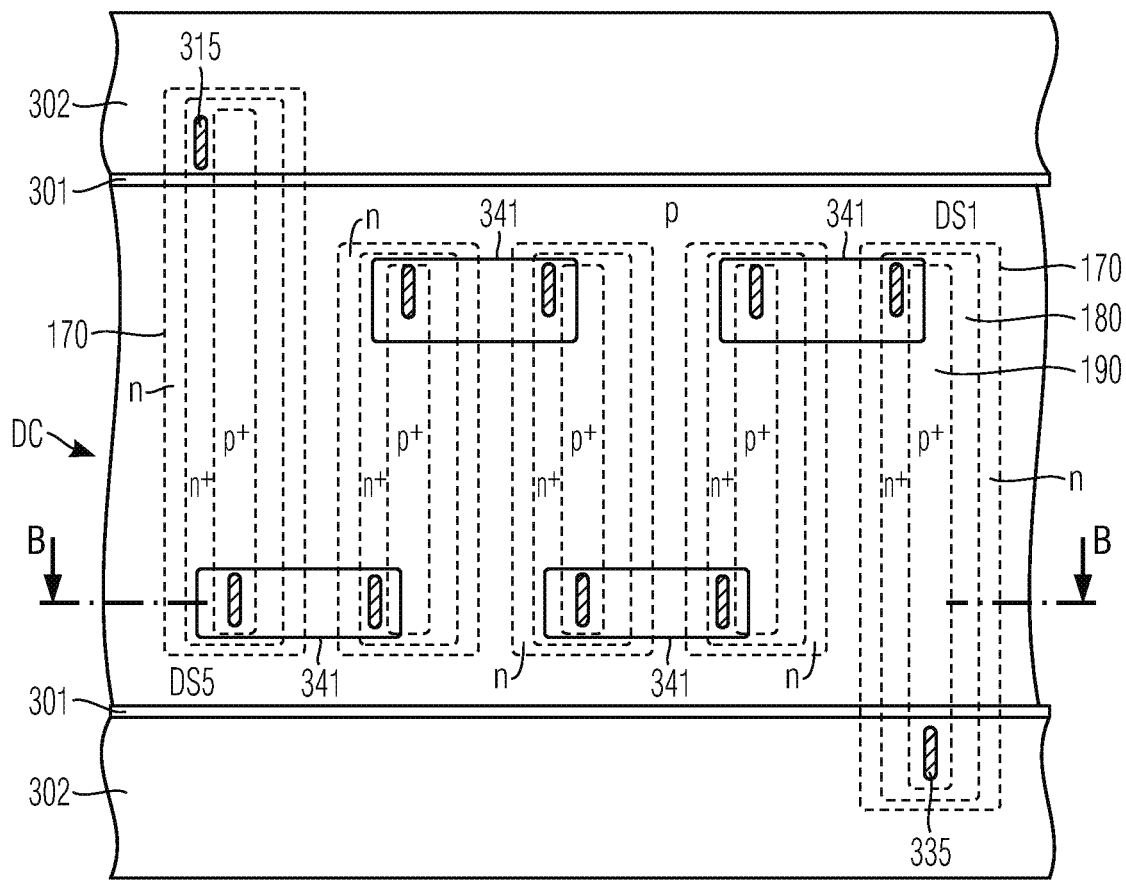
FIGS. 8A and 8B show a schematic plan view and a schematic vertical cross-sectional view of a semiconductor device according to an embodiment with the diode chain including laterally separated stripe-shaped diode wells arranged along a direction parallel to a lateral longitudinal extension of a nearest gate runner line portion and with one of the diode wells extending to below the gate runner.
Figure 8B:
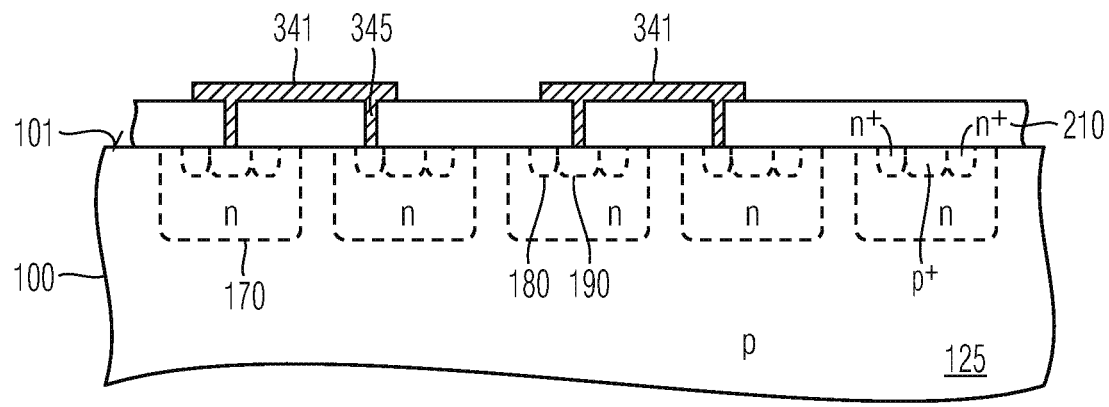

In FIGS. 8A and 8B the diode well 170 of the first diode structure DS1 laterally extends to below the gate runner 336 and a gate/diode contact structures 335 extends vertically from the gate runner 336 to or into the anode region 190 of the first diode structure DS1.

The diode well 170 of the fifth diode structure DS5 laterally extends to below the source runner 316 and a source contact structure 315 extends vertically from the source runner 316 to or into the cathode region 180 of the fifth diode structure DS5.

Figure 9A:
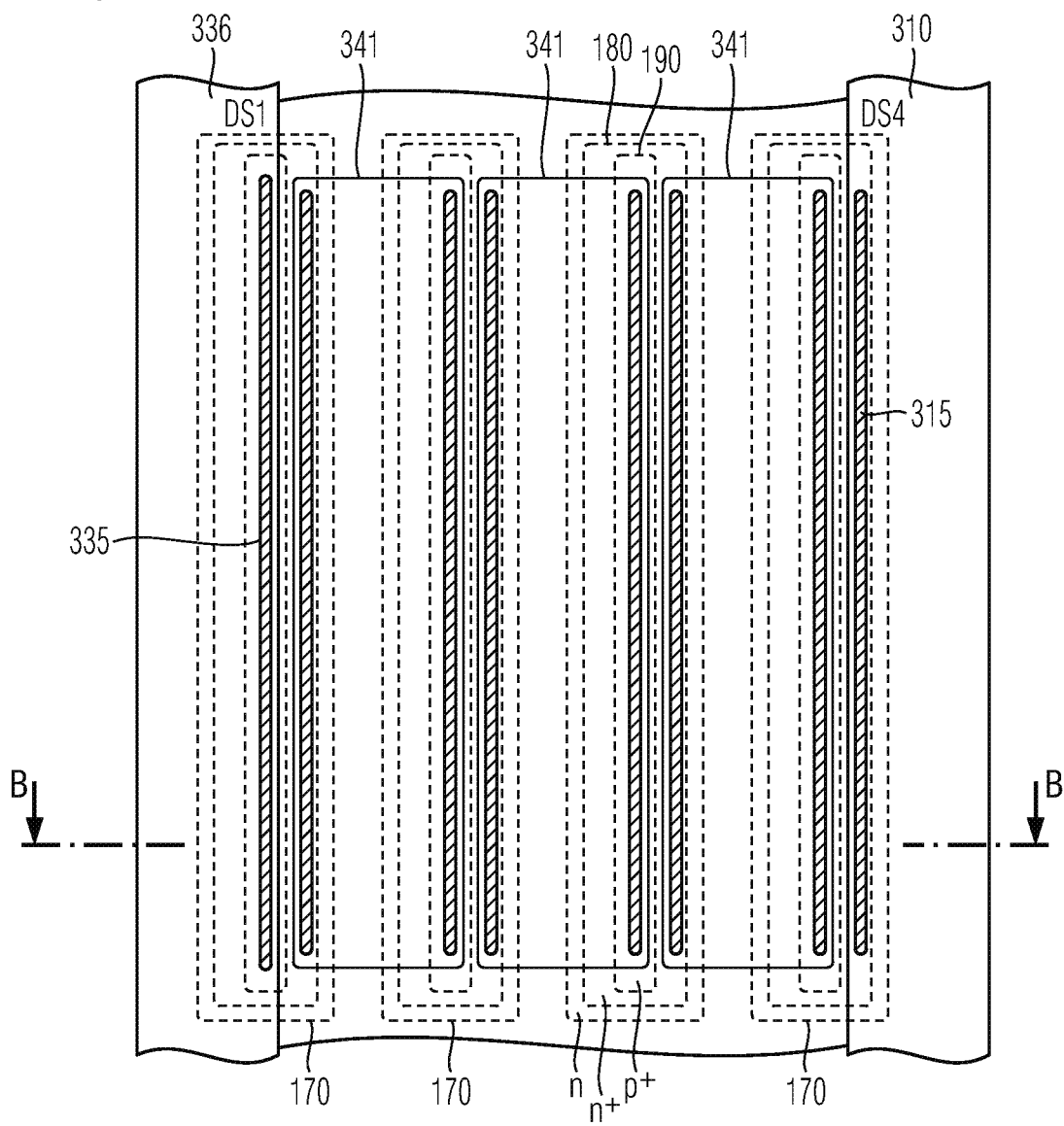
FIGS. 9A and 9B show a schematic plan view and a schematic vertical cross-sectional view of a semiconductor device according to an embodiment with the diode chain including laterally separated stripe-shaped diode wells formed between gate runner and source pad.
Figure 9B:
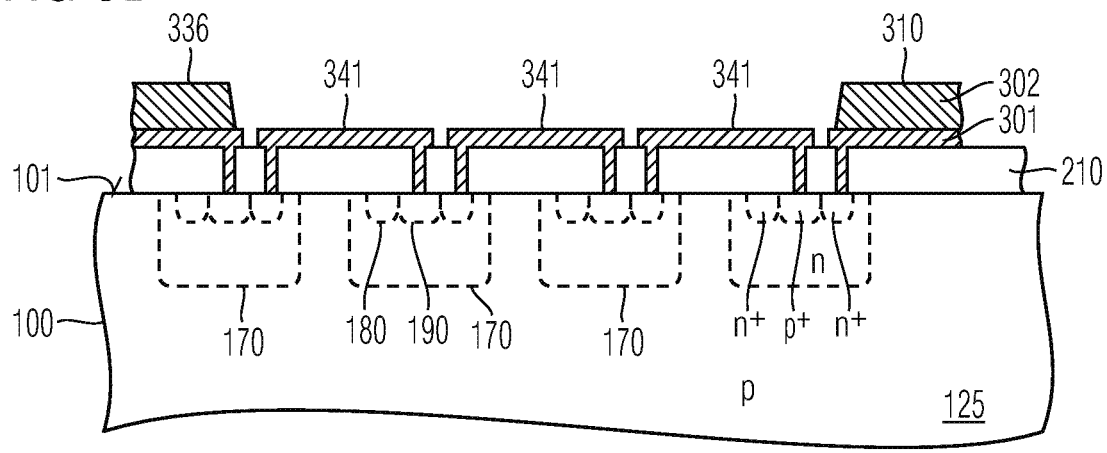

In FIGS. 9A and 9B the diode wells 170 of a diode chain DC with four diode structures DS1, . . . , DS4 are arranged between a gate runner 336 and a source electrode structure 310 along a direction orthogonal to a lateral longitudinal extension of the nearest line portion of the gate runner 336. The source electrode structure 310 may be a source pad or a source runner. The diode wells 170 are lined up one behind the other along a line orthogonal to the nearest gate runner line portion.

The diode well 170 of the first diode structure DS1 laterally extends to below the gate runner 336 and a gate/diode contact structure 335 extends vertically from the gate runner 336 to or into the anode region 190 of the first diode structure DS1.

The diode well 170 of the fourth diode structure DS4 laterally extends to below the source electrode structure 310 and a source contact structure 315 extends vertically from the source electrode structure 310 to or into the cathode region 180 of the fourth diode structure DS4.

Figure 10:
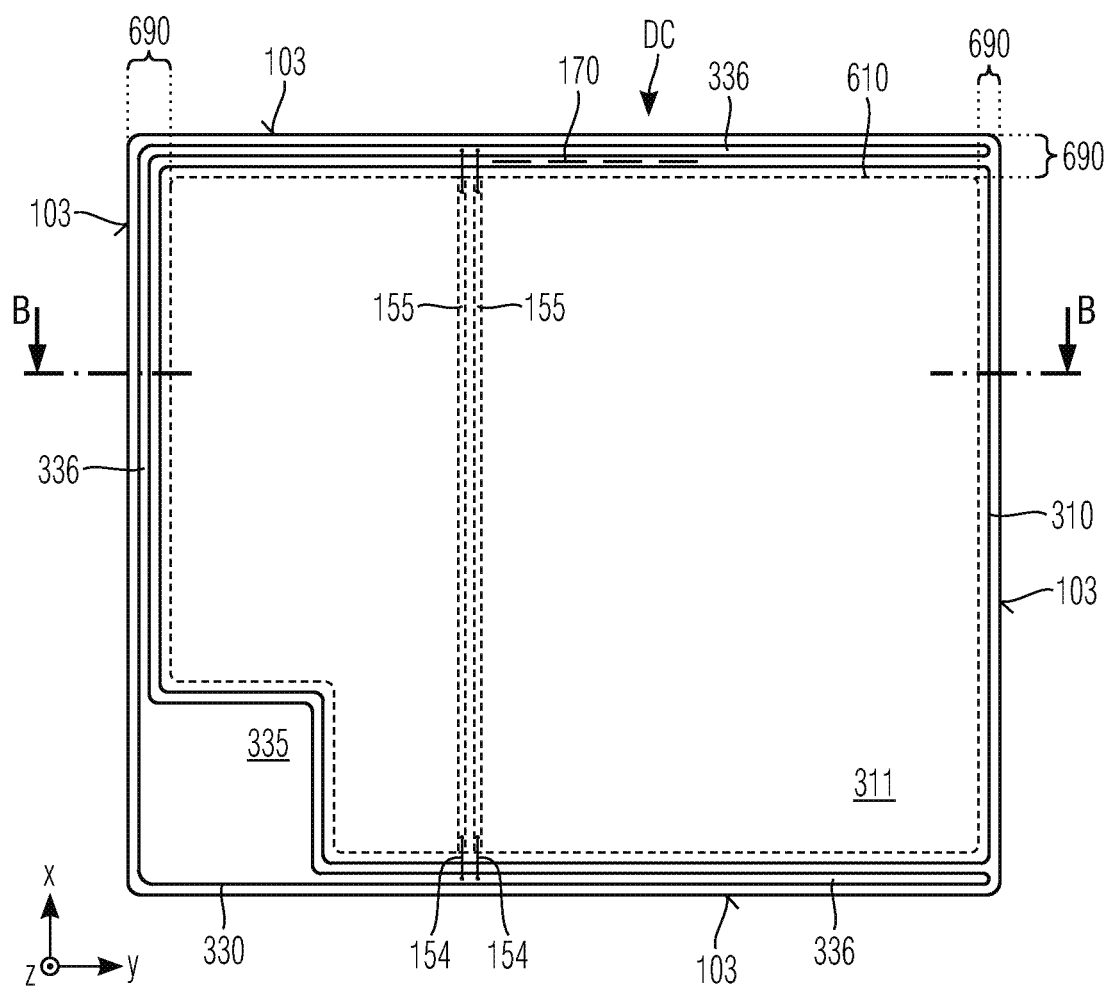
FIG. 10 shows a schematic plan view of a semiconductor device according to an embodiment with the diode chain formed between a source pad and a gate runner line portion with a lateral longitudinal extension orthogonal to a lateral longitudinal extension of gate structures.

FIG. 10 shows a diode chain DC formed between a line portion of a gate runner 336 and a source pad 311, wherein the gate runner line portion runs parallel to the y-axis and orthogonal to the lateral longitudinal extension of the gate electrodes 155. The gate electrodes 155 may end below the source pad 311 and do not extend into the space between the source pad 311 and the gate runner line portion.

A gate conductor plate 154 formed on the first surface laterally extends from the central region 610 to the gate runner 336 and is in direct contact with both the gate electrodes 155 and the gate runner 336. The gate conductor plate 154 is formed from the same material as the gate electrodes 155 and by the same deposition and patterning processes such that the gate electrodes 155 and the gate conductor plate 154 are different sections of a deposited layer of conductive material, e.g. metallic polycrystalline silicon.

Figure 11A:
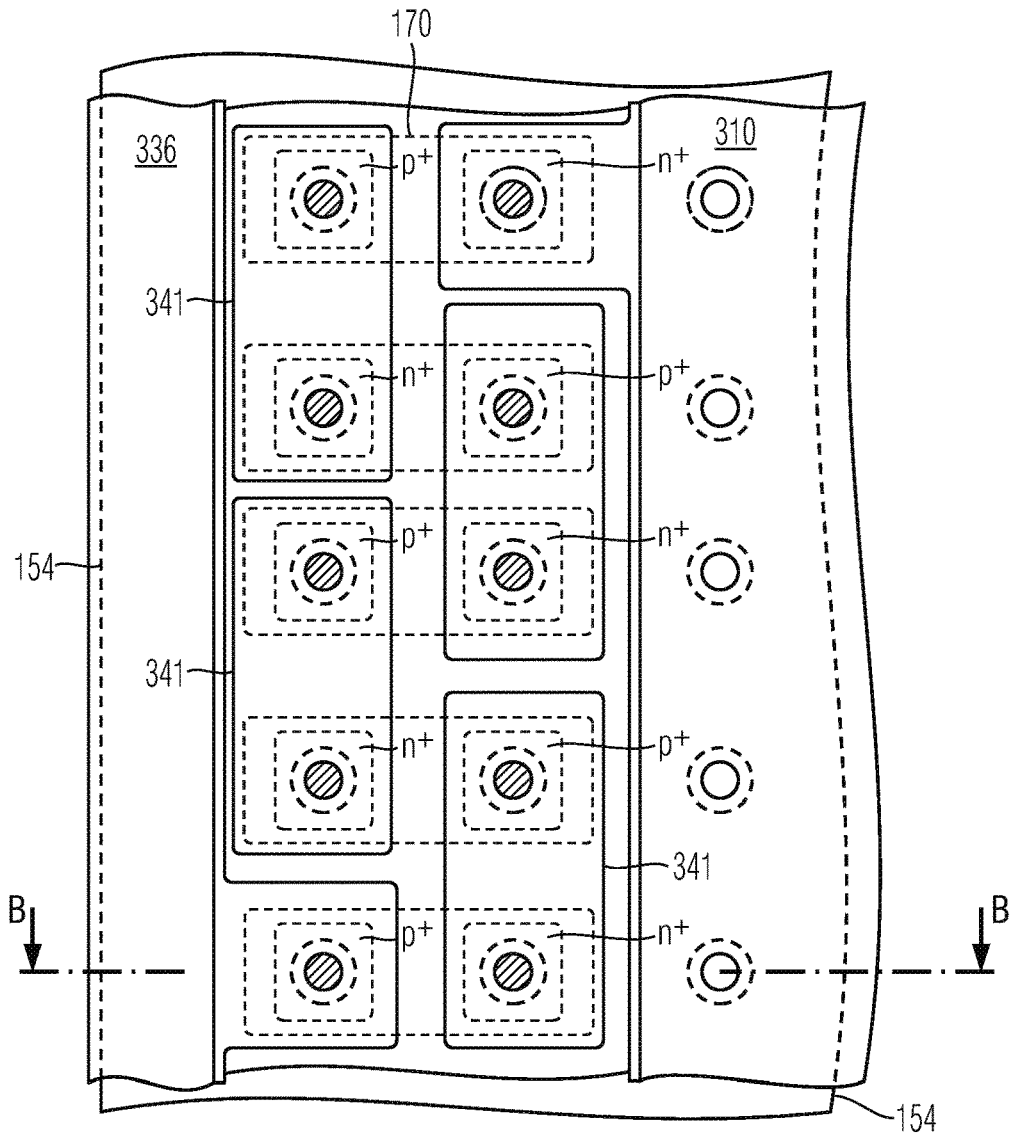
FIGS. 11A and 11B show a schematic plan view and a schematic vertical cross-sectional view of a semiconductor device according to an embodiment with the diode chain including laterally separated stripe-shaped diode wells and a gate conductor plate.
Figure 11B:
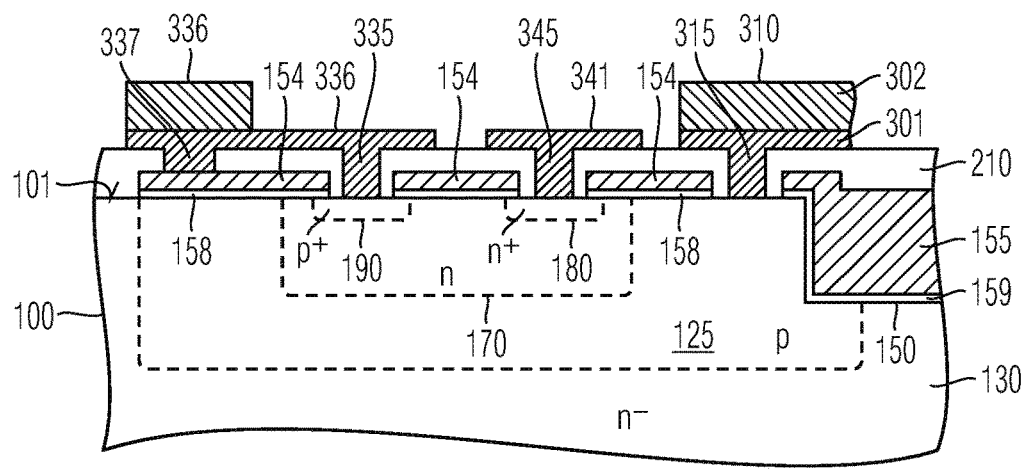

FIGS. 11A and 11B show a gate conductor plate 154 formed on the first surface 101 of the wide bandgap semiconductor portion 100. A dielectric layer 158 separates the gate conductor plate 154 and the wide bandgap semiconductor portion 100. The dielectric layer 158 may have the same material configuration and thickness as the gate dielectric 159. Dielectric layer 158 and gate dielectric 159 may be different sections of the same layer.

The interlayer dielectric 210 covers a top surface the gate conductor plate 154. Source contact structures 315, wiring contact structures 345 and gate/diode contact structures 335 extend through openings in the gate conductor plate 154, wherein the interlayer dielectric 210 lines the sidewalls of the openings in the gate conductor plate 154. Gate-to-gate contact structures 337 of the gate runner 336 extend through further openings in the interlayer dielectric 210 above the gate conductor plate 154 and electrically connect the gate runner 336 and the gate conductor plate 154.

Figure 12:
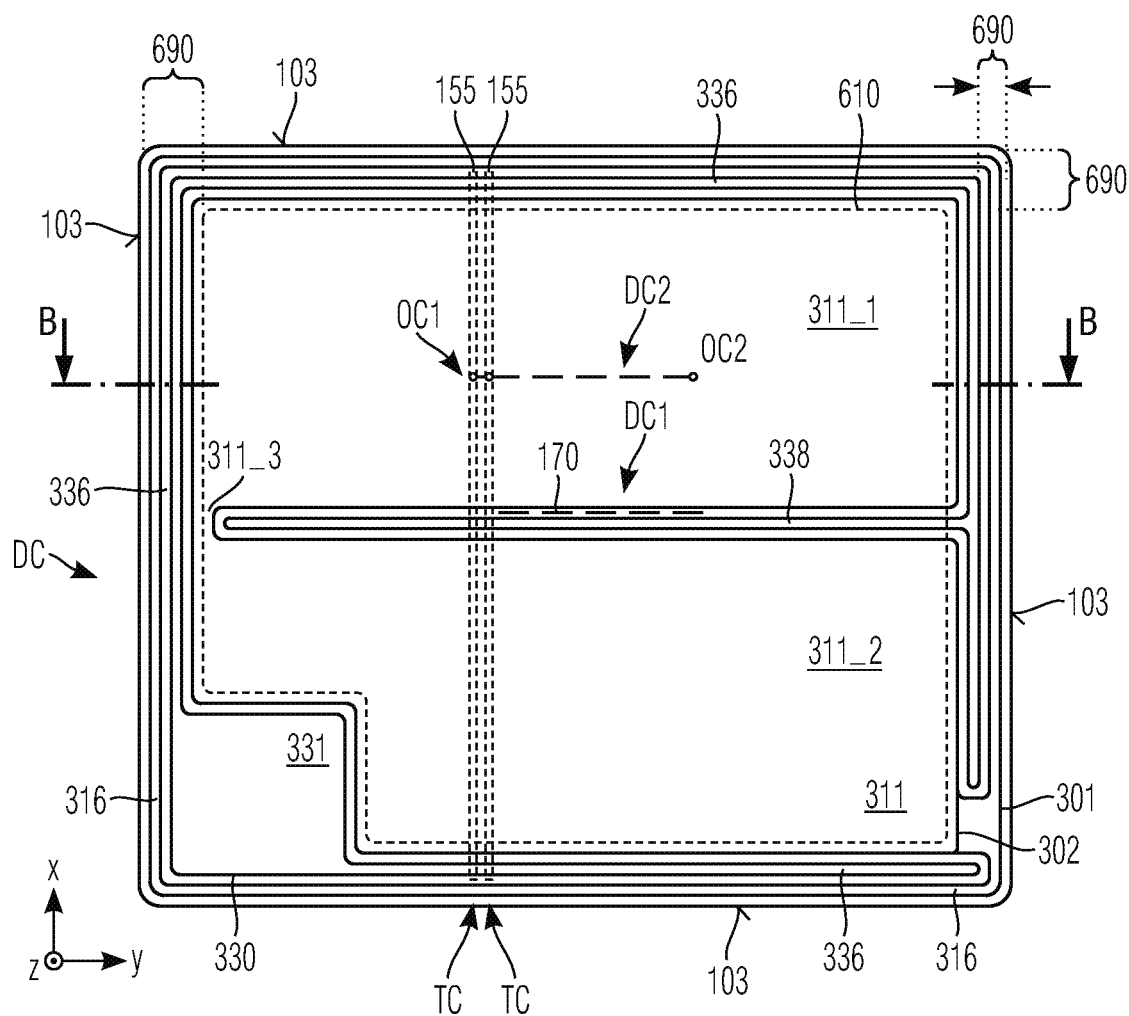
FIG. 12 shows a schematic plan view of a semiconductor device according to an embodiment with diode chains formed in a central region of a wide bandgap semiconductor portion.

In FIG. 12 the gate metallization includes a gate finger 338 extending from one of the second line portions of the gate runner 336 into the central region 610. The gate finger 338 is electrically connected with at least some of the gate electrodes 155. In particular, the gate finger 338 runs parallel to the y-axis and orthogonal to the gate electrodes 155. The gate finger 338 is connected to one single second line portion of the gate runner 336 and is spaced from the opposite second line portion of the gate runner 336. A bar portion 311_3 of the source pad 311 connects two main parts 311_1, 331_2 of the source pad 311, which are formed on opposite sides of the gate finger 338.

A first diode chain DC1 is formed parallel to and in close vicinity to the gate finger 338. In particular, the first diode chain DC1 is formed between the gate finger 338 and one or both of the two main parts 311_1, 311_2 of the source pad 311. The diode wells 170 are lined up one behind the other along a line parallel to the gate finger 338 and between the gate finger 338 and the first main part 311_1 of the source pad 311.

Alternatively or in addition, a second diode chain DC2 is formed below an opening in the source pad 311, wherein the source pad 311 surrounds the second diode chain DC2. In particular, the source pad 311 surrounds the second diode chain DC2 completely, i.e. on all four lateral sides. The source pad 311 may be opened above the second diode chain DC2 in order to avoid electric shorts between the different diodes in diode chain DC2. Connections between the respective anode and cathode regions in the diode chain DC2 may be formed using patterned parts of a deposited metal layer forming the source pad 311 outside the area of the diode chain DC2.

The first ohmic contact OC1 to the anode of the first diode structure of the second diode chain DC2 may include several separated contact areas, wherein each contact area provides a low-resistive ohmic contact to another one of the gate electrodes 155. A source contact structure extending from the source pad 311 to the cathode of the last diode structure of the second diode chain DC2 forms the second ohmic contact OC2 of the second diode chain DC2.

What is claimed is:

1. A semiconductor device, comprising:
   a transistor cell comprising a source region of a first conductivity type and a gate electrode, wherein the source region is formed in a wide bandgap semiconductor portion;
   a diode chain including a plurality of diode structures formed in the wide bandgap semiconductor portion and electrically connected in series, wherein each diode structure comprises a cathode region of the first conductivity type and an anode region of a complementary second conductivity type;
   a gate metallization electrically connected with the gate electrode and with a first one of the anode regions in the diode chain;
   a source electrode structure electrically connected with the source region and with a last one of the cathode regions in the diode chain; and
   a plurality of diode wells of the first conductivity type, wherein each anode region and each cathode region of the diode chain extends into one of the diode wells,
   wherein the cathode regions of the diode chain have a higher doping concentration than the diode wells.

2. The semiconductor device of claim 1, wherein the gate metallization and the first one of the anode regions in the diode chain form a first ohmic contact.

3. The semiconductor device of claim 1, wherein the source electrode structure and the last one of the cathode regions in the diode chain form a second ohmic contact.

4. The semiconductor device of claim 1, wherein for each neighboring pair of the diode structures, a wiring structure forms an ohmic contact with the cathode region of a first one of the neighboring diode structures and forms an ohmic contact with the anode region of a second one of the neighboring diode structures.

5. The semiconductor device of claim 1, wherein a plurality of the transistor cells is formed in a central region of the wide bandgap semiconductor portion, wherein a peripheral region at least partly surrounds the central region, and wherein the diode chain is formed in the peripheral region.

6. The semiconductor device of claim 5, wherein the diode wells extend from a first surface into a lateral extension region of the second conductivity type, and wherein the lateral extension region extends outwardly from the central region into a direction of a lateral outer surface of the wide bandgap semiconductor portion.

7. The semiconductor device of claim 6, wherein the lateral extension region separates the diode wells from each other.

8. The semiconductor device of claim 5, wherein the gate electrodes of the plurality of transistor cells are stripe-shaped, wherein the gate metallization comprises a gate runner formed in the peripheral region, and wherein the gate runner and the gate electrodes are electrically connected.

9. The semiconductor device of claim 8, wherein the diode wells of the diode chain are arranged along a direction orthogonal to a lateral longitudinal extension of a nearest line portion of the gate runner.

10. The semiconductor device of claim 8, wherein the diode wells of the diode chain are arranged along a direction parallel to a lateral longitudinal extension of a nearest line portion of the gate runner.

11. The semiconductor device of claim 8, wherein the source electrode structure comprises a source pad formed on the first surface in the central region.

12. The semiconductor device of claim 11, wherein the diode chain is formed between the source pad and the gate runner, and wherein the source pad and the last one of the cathode regions in the diode chain form an ohmic contact.

13. The semiconductor device of claim 8, wherein the source electrode structure comprises a source runner formed on the first surface, wherein the source runner and the lateral extension region form an ohmic contact, and wherein the source runner and the last one of the cathode regions in the diode chain form an ohmic contact.

14. The semiconductor device of claim 8, wherein the gate metallization comprises a gate finger extending from at least one line portion of the gate runner into the central region, and wherein the diode chain is formed parallel to and in close vicinity to the gate finger.

15. A semiconductor device, comprising:
   a transistor cell comprising a source region of a first conductivity type and a gate electrode, wherein the source region is formed in a wide bandgap semiconductor portion;
   a diode chain including a plurality of diode structures formed in the wide bandgap semiconductor portion and electrically connected in series, wherein each diode structure comprises a cathode region of the first conductivity type and an anode region of a complementary second conductivity type;
   a gate metallization electrically connected with the gate electrode and with a first one of the anode regions in the diode chain; and
   a source electrode structure electrically connected with the source region and with a last one of the cathode regions in the diode chain,
   wherein a plurality of the transistor cells is formed in a central region of the wide bandgap semiconductor portion,
   wherein a peripheral region at least partly surrounds the central region, and wherein the diode chain is formed in the peripheral region.

16. The semiconductor device of claim 15, wherein the gate electrodes of the plurality of transistor cells are stripe-shaped, wherein the gate metallization comprises a gate runner formed in the peripheral region, and wherein the gate runner and the gate electrodes are electrically connected.

17. The semiconductor device of claim 16, wherein the source electrode structure comprises a source pad formed on the first surface in the central region.

18. The semiconductor device of claim 17, wherein the diode chain is formed between the source pad and the gate runner, and wherein the source pad and the last one of the cathode regions in the diode chain form an ohmic contact.

19. The semiconductor device of claim 16, wherein the gate metallization comprises a gate finger extending from at least one line portion of the gate runner into the central region, and wherein the diode chain is formed parallel to and in close vicinity to the gate finger.

\* \* \* \* \*